United States Patent
Druml et al.

(10) Patent No.: US 12,237,840 B2
(45) Date of Patent: Feb. 25, 2025

(54) DETECTION, CORRECTION, AND COMPENSATION OF COUPLING EFFECTS OF MICROELECTROMECHANICAL SYSTEM (MEMS) AXES OF A TWO-DIMENSIONAL SCANNING STRUCTURE

(71) Applicant: Infineon Technologies AG, Neubiberg (DE)

(72) Inventors: Norbert Druml, Graz (AT); Stephan Gerhard Albert, Munich (DE); Franz Michael Darrer, Graz (AT); Philipp Greiner, Graz (AT)

(73) Assignee: Infineon Technologies AG, Neubiberg (DE)

( * ) Notice: Subject to any disclaimer, the term of this patent is extended or adjusted under 35 U.S.C. 154(b) by 783 days.

(21) Appl. No.: 17/403,083

(22) Filed: Aug. 16, 2021

(65) Prior Publication Data

US 2023/0051926 A1 Feb. 16, 2023

(51) Int. Cl.
G02B 26/08 (2006.01)
H03B 5/32 (2006.01)
H03L 7/099 (2006.01)

(52) U.S. Cl.
CPC .......... *H03L 7/099* (2013.01); *G02B 26/0833* (2013.01); *H03B 5/32* (2013.01)

(58) Field of Classification Search
CPC ....... H03L 7/099; H03L 7/07; G02B 26/0833; G02B 26/0841; G02B 26/101; H03B 5/32; G01S 7/4817
See application file for complete search history.

(56) References Cited

U.S. PATENT DOCUMENTS 8,331,005 B2 * 12/2012 Burinskiy ................ G09G 3/02
359/199.1
2020/0319450 A1 * 10/2020 Druml ................ G02B 26/0841

* cited by examiner

Primary Examiner — Euncha P Cherry
(74) Attorney, Agent, or Firm — Harrity & Harrity, LLP

(57) ABSTRACT

An oscillator control system includes an oscillator structure configured to oscillate about first and second rotation axes according to a Lissajous pattern, wherein an oscillation about the second rotation axis imparts a cross-coupling error onto an oscillation about the first rotation axis, and wherein the cross-coupling error changes in accordance with a Lissajous position within the Lissajous pattern; and a driver circuit that includes a phase-locked loop (PLL) configured to regulate a driving signal that drives the oscillation about the first rotation axis. The PLL is configured to generate a PLL signal based on a phase error of the oscillation about the first rotation axis. The PLL includes a compensation circuit configured to receive the PLL signal and the Lissajous position within the Lissajous pattern, apply a compensation value to the PLL signal to generate a compensated PLL signal used for generating the driving signal based on the Lissajous position.

19 Claims, 10 Drawing Sheets

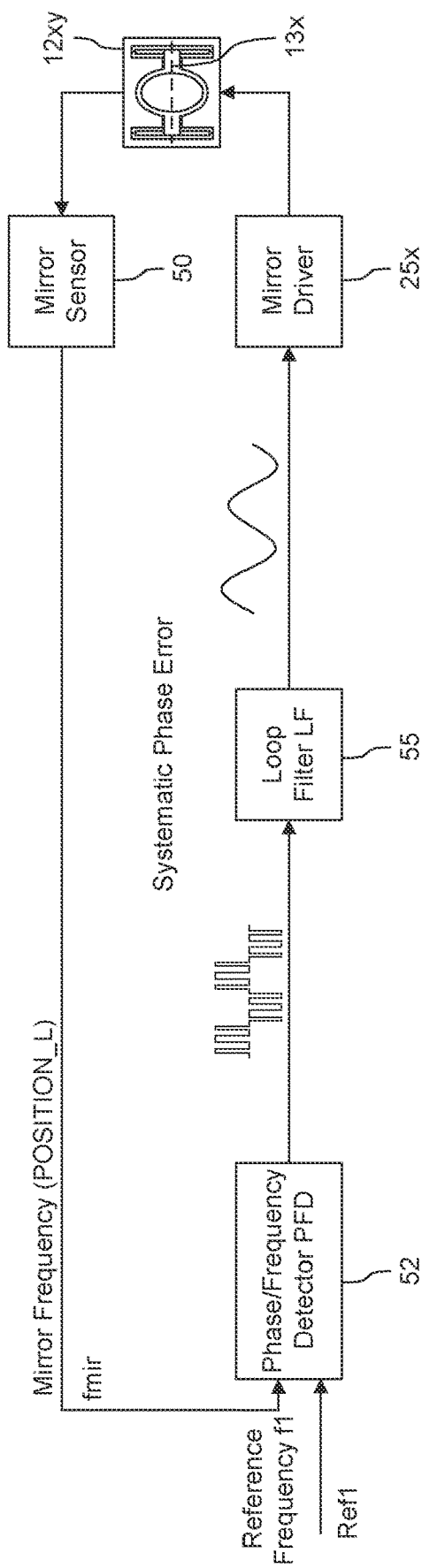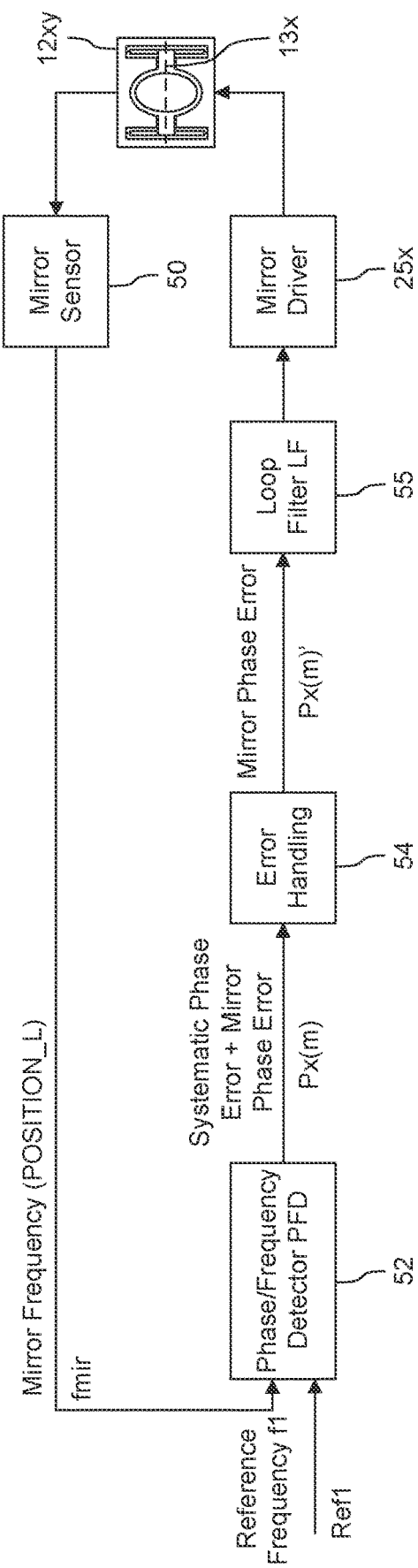
FIG. 8C
FIG. 8D

DETECTION, CORRECTION, AND COMPENSATION OF COUPLING EFFECTS OF MICROELECTROMECHANICAL SYSTEM (MEMS) AXES OF A TWO-DIMENSIONAL SCANNING STRUCTURE

BACKGROUND

Scanning a collimated light beam over a two-dimensional field of view in a defined manner and with high frequency is relevant for various applications such as light-detection-and-ranging (LiDAR) or projection purposes in augmented reality (AR)-applications. Due to their compactness and compatibility for high-volume production, microelectromechanical scanners (e.g., MEMS scanning mirrors) attract much attention as a key component of the beam steering unit of such systems.

In order to deflect the light in two orthogonal directions, a beam steering system can incorporate two separate MEMS devices on two separate chips, of which each serves one axis. The two MEMS chips are spatially arranged in a manner such that the light beam, which is deflected by the first scanning mirror in the first direction, hits the second scanning mirror, which provides the deflection in the second (orthogonal) direction. Thus, two one-dimensional (1D) MEMS scanning mirrors, each having one operational degree of freedom about a respective scanning axis, can be used to steer light in two dimensions. As an alternative, a two-dimensional (2D) MEMS scanning mirror that has two operational degrees of freedom about two scanning axes in the same device can be used to steer light in two dimensions.

In both realizations, each of the two axes can be designed for quasistatic (QS) operation or resonant (RES) operation. More specifically, all of the combinations QS/QS, QS/RES, and RES/RES are possible. However, the frequencies, in which a QS mirror can be operated, are generally much lower (scale 10-500 Hz, strongly dependent on size) than the resonant frequencies of MEMS mirrors (scale 1-40 kHz, strongly dependent on size). Therefore, the QS/QS combination is of little practical relevance since it cannot provide a high-resolution scanning pattern at an acceptable frame rate.

For both realizations a movable mirror body (rotor) is suspended from a semiconductor chip frame by springs, which provide restoring forces. In order to deflect light, the mirror body needs to be rotatable about one (1D) or two (2D) operational axes. The MEMS mirror is rotated by an actuation mechanism. Common actuation schemes for MEMS mirrors are electrostatic, piezoelectric, and electromagnetic actuation. All of them can be used both for QS and for RES actuation. Electrostatic actuation is usually realized by interdigitated out-of-plane comb drive structures, which form a capacitance that varies with MEMS position.

Even if the rotor of a 1D mirror is assumed to be perfectly rigid, the mirror body suspended by the springs has six (rigid body) degrees of freedom (DOFs), three translational and three rotational, each of which is associated with an eigenmode oscillation. Ideally, in operation, the MEMS mirror performs only deflections in one of these DOFs, i.e., the one associated with the intended rotation. A design target for a MEMS mirror is therefore to suppress all undesired eigenmodes, which means that their eigenfrequencies should be as high as possible. This is achieved by designing the springs in a manner, where they are only compliant for the intended rotational motion, while being as stiff as possible for all other translations and rotations.

For the definition of the two operational axes of a 2D MEMS scanner, there are two principle possibilities. Either there is a hierarchical definition of the axes or the two axes are equivalent. The first case is realized by so-called gimbal MEMS devices with cardanic mounting while the second case is realized by tripod or quadpod designs with (nearly) degenerate eigenfrequencies due to symmetry.

The first realization of a 2D beam steering unit by two 1D-scanners has the drawback of a less compact system integration than in the case of a 2D MEMS due to the need of arranging two chips at an angle with respect to each other. However, it has the advantage of a considerably better defined motion than true 2D mirrors.

To illustrate this, the 2D gimbal MEMS scanner is considered. The 2D MEMS scanner has an inner scanning axis (i.e., an inner mirror rotor) and an outer scanning axis (i.e., an outer mirror rotor) with the latter generally oscillating at a lower frequency than the former. Neglecting the non-perfect rigidity of the (inner) mirror rotor and the gimbal frame, the scanner still has twelve rigid body degrees of freedom, three translational and three rotation for both the inner mirror body and the gimbal frame. Additionally, the gimbal frame adds much additional mass, which needs to be moved for deflection about the outer axis. Generally, this results in a considerably worse suppression of the undesired (parasitic) modes and in cross-talk behavior of the two axes than for a 1D mirror.

There are several mechanisms by which the two operational modes of a 2D gimbal MEMS scanner can influence each other.

For example, the eigenmodes for the inner rotation and the outer rotation are not the pure rotations of the mirror body and the gimbal frame, respectively. Rather, these eigenmodes or normal modes have a small admixture of a rotation of the respective other body about the same axis. For example, the mirror body's operational eigenmode includes a small rotation of the gimbal frame about the axis of the (inner) mirror body, which is perpendicular to the operational axis of the (outer) gimbal frame. This motion is called a (parasitic) "pitch" motion of the gimbal frame, where the desired motions of the two axes are called the "roll" motions of the two bodies.

As another example, the mirror body and the gimbal frame can encompass stiffening structures on the bottom sides. These stiffening structures shift the center of mass of those bodies, resulting in mismatches of the z-locations of the rotation axes and the centers of mass. This rotating unbalance leads to inertial forces (Euler force, centrifugal force) acting on the center of mass when bodies oscillate about the rotational axes. This leads to an excitation of the translational degrees of freedom.

As another example, the inner mirror body moves within the rotating reference frame of the gimbal frame. This leads to a Coriolis force acting on the inner mirror body, which can excite other rotational degrees of freedom, e.g., pitch and yaw motions of the mirror body.

In order to control amplitude (i.e., the deflection or rotational angle about an axis) and phase, a MEMS scanner usually cannot be operated in open loop. Rather, it must be actuated in closed loop, e.g., with a phase-locked loop. This requires a sensing scheme to obtain information about the current state of the rotation. Such information usually requires at least the knowledge of two quantities at all times, e.g., the amplitude and the phase or the current deflection angle and the angular velocity. Particularly for two resonant scanners, which are operated to scan a constant Lissajous pattern with an optimal grid resolution, the control of the relative phase of the oscillations about the two axes is of paramount importance.

The ability to accurately sense the position information (e.g., rotation angle) of the scanning mirror about its scanning axis or axes is crucial to accurate laser shooting. More accurate and precise position information leads to more accurate laser shooting, better scanning resolution, and better scanning pattern generation. For electrostatic MEMS mirrors a self-sensing scheme is convenient since it does not require any sensing devices additional to the actuator. For resonant MEMS mirrors, a current self-sensing scheme is convenient because the actuation and resulting oscillation of the MEMS mirror lead to periodic charging and discharging currents of the comb drive electrodes. These currents can be measured and information on the scanner's state can be derived by analysis of the timing of the recurrences of distinct features of those currents, e.g., zero-crossings of the currents or peaks of the currents. For example, a suitable combination of the various comb drive arms can be formed and the summed current of this combination can be analyzed. If this combination is symmetric (which means that equivalent symmetric arms from the left and the right side from the rotation axis must be added), a current zero-crossing of this summed current occurs exactly at the same time as the mechanical zero-crossing of the associated rotating body.

The above described mode coupling phenomena and the associated parasitic motions of the scanner, i.e., of the mirror body and/or of the gimbal frame, also change the variable capacitance of the comb drive capacitor and therefore lead to displacement currents in the same way as the intended motions (the two rotations of the mirror frame and the gimbal frame). These parasitic currents are added to the currents from the intended motions and—a priori—the mechanical sources of these currents cannot be distinguished. For the example of the zero-crossing, this means that the current zero-crossing is not synchronous with the mechanical zero-crossing but is advanced ahead or lagged behind the mechanical zero-crossing. In a naïve approach, this would lead to a wrong determination of the state of the MEMS scanner about one or both of the axes, i.e., a wrong determination of the phase and/or amplitude of the MEMS scanner about a respective axis. The result would be an ill-controlled scan pattern with deteriorated resolution, flickering, amplitude variations, etc. causing an unstable spherical angle of the projection image, for example.

Therefore, a means to detect, correct, and compensate cross-coupling effects between the axes of a 2D MEMS mirror may be desirable. For example, a means for compensating for mode coupling effects and motion admixtures originating from one 2D scanning axis that are superimposed onto the sensing currents of the other 2D scanning axis may be desirable in order to improve the scanning operation of a 2D MEMS mirror.

SUMMARY

One or more embodiments provide an oscillator control system that includes an oscillator structure configured to simultaneously oscillate about a first rotation axis and a second rotation axis according to a Lissajous pattern that repeats on a frame-by-frame basis, wherein an oscillation about the second rotation axis imparts a deterministic cross-coupling error onto an oscillation about the first rotation axis, and wherein the deterministic cross-coupling error changes in accordance with a Lissajous position of the oscillator structure within the Lissajous pattern; a driver circuit configured to generate a first driving signal to drive the oscillator structure about the first rotation axis at a first driving frequency and generate a second driving signal to drive the second oscillator structure about the second rotation axis at a second driving frequency that is different from the first driving frequency to generate the Lissajous pattern, wherein the driver circuit includes a phase-locked loop (PLL) configured to regulate the oscillation about the first rotation axis, wherein the PLL is configured to generate a PLL signal based on a phase error of the oscillation about the first rotation axis, wherein the PLL includes a compensation circuit configured to receive the PLL signal and a Lissajous position signal that indicates the Lissajous position within the Lissajous pattern, wherein the compensation circuit is configured to apply a compensation value to the PLL signal, thereby modifying the PLL signal to generate a compensated PLL signal used for generating the first driving signal, wherein the compensation circuit is configured to determine the compensation value is based on the Lissajous position indicated by the Lissajous position signal.

One or more embodiments provide a method for controlling an oscillator that includes driving the oscillator structure to simultaneously oscillate about a first rotation axis and a second rotation axis according to a Lissajous pattern that repeats on a frame-by-frame basis, wherein an oscillation about the second rotation axis imparts a deterministic cross-coupling error onto an oscillation about the first rotation axis, wherein the deterministic cross-coupling error changes in accordance with a Lissajous position within the Lissajous pattern, wherein driving the oscillator structure further includes generating a first driving signal to drive the oscillator structure about the first rotation axis at a first driving frequency and generating a second driving signal to drive the second oscillator structure about the second rotation axis at a second driving frequency that is different from the first driving frequency to generate the Lissajous pattern; regulating the oscillation about the first rotation axis with a phase-locked loop (PLL), including generating a PLL signal based on a phase error of the oscillation about the first rotation axis; and compensating the PLL signal using a Lissajous position signal that indicates the Lissajous position within the Lissajous pattern and compensation information including a first set of compensation values, wherein each compensation value of the first set of compensation values is encoded to a different Lissajous position within the Lissajous pattern, wherein compensating the PLL signal further includes selecting a compensation value from the first set of compensation values based on the Lissajous position indicated by the Lissajous position signal and applying the selected compensation value of the first set of compensation values to the PLL signal, thereby modifying the PLL signal to generate a compensated PLL signal used for generating the first driving signal.

One or more embodiments provide an oscillator control system that includes an oscillator structure configured to simultaneously oscillate about a first rotation axis and a second rotation axis at different frequencies, wherein an oscillation about the second rotation axis imparts a systematic phase error onto an oscillation about the first rotation axis, and wherein the systematic phase error changes over time in a sinusoidal manner; a driver circuit configured to generate a first driving signal to drive the oscillator structure about the first rotation axis and generate a second driving signal to drive the second oscillator structure about the second rotation axis, wherein the driver circuit includes a primary phase-locked loop (PLL) configured to regulate the oscillation about the first rotation axis, wherein the primary PLL includes a primary phase error detector configured to generate a phase error signal based on a phase deviation of the oscillation about the first rotation axis from an expected oscillation phase and output the phase error signal, wherein the systematic phase error is superimposed onto the phase error signal, wherein the primary PLL includes a compensation circuit configured to receive the phase error signal, replicate the systematic phase error from the phase error signal, and subtract the replicated systematic phase error from the phase error signal to generate a compensated phase error signal used for generating the first driving signal.

One or more embodiments provide a method for controlling an oscillator structure that includes driving the oscillator structure to simultaneously oscillate about a first rotation axis and a second rotation axis at different frequencies, wherein an oscillation about the second rotation axis imparts a systematic phase error onto an oscillation about the first rotation axis, and wherein the systematic phase error changes over time in a sinusoidal manner, wherein driving the oscillator structure further includes generating a first driving signal to drive the oscillator structure about the first rotation axis and generating a second driving signal to drive the second oscillator structure about the second rotation axis; regulating the oscillation about the first rotation axis with a primary phase-locked loop (PLL), including generating a phase error signal based on a phase deviation of the oscillation about the first rotation axis from an expected oscillation phase and output the phase error signal, wherein the systematic phase error is superimposed onto the phase error signal; and compensating the phase error signal, including replicating the systematic phase error from the phase error signal and subtracting the replicated systematic phase error from the phase error signal to generate a compensated phase error signal used for generating the first driving signal.

BRIEF DESCRIPTION OF THE DRAWINGS

Embodiments are described herein making reference to the appended drawings.

FIGS. 8A-8D illustrate a schematic block diagram of a PLL of the MEMS control system according to one or more embodiments.

DETAILED DESCRIPTION

Figure 1:
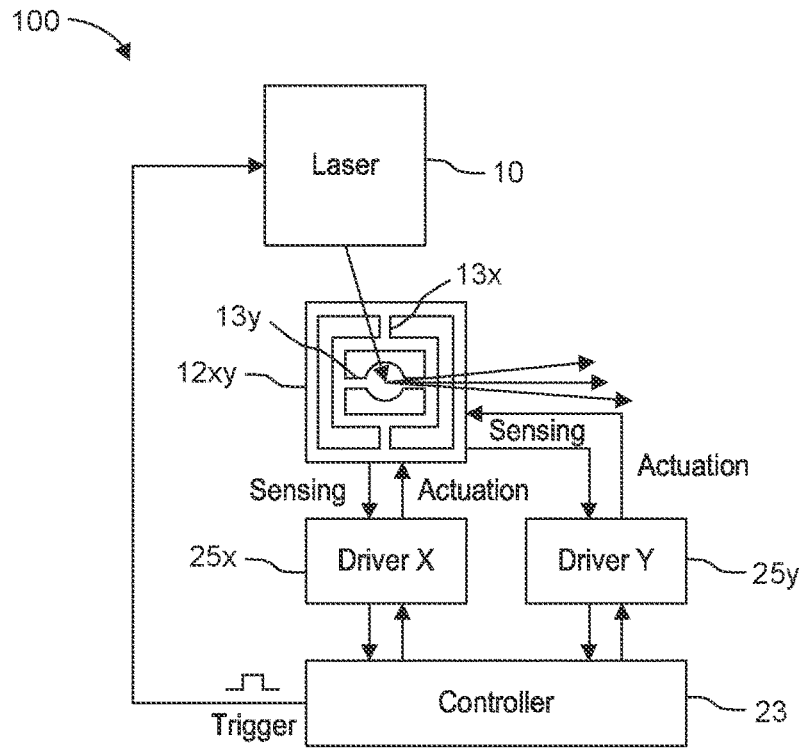
FIG. 1 is a schematic block diagrams of 2D scanning system according to one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical transmitters and optical transmitter systems configured to transmit light beams or pulses according to a scanning pattern, and, more particularly, according to a 2D scanning pattern such as a Lissajous scanning pattern. Light beams include visible light, infrared (IR) light, or other type of illumination signals. In some applications, the transmitted light may be backscattered by an object back towards the system where the backscattered light is detected by a sensor. The sensor may convert the received backscattered light into an electric signal, for example a current signal or a voltage signal, that may be further processed by the system to generate object data and/or an image.

For example, in Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light. Differences in return times for each light pulse across multiple pixels of the pixel array can then be used to make digital 3D representations of an environment or to generate other sensor data.

A Lissajous scan (e.g., according to a Lissajous scanning pattern that employs two scanning axes) can illuminate a scene in a continuous scan fashion. By emitting successive light pulses in different scanning directions, an area referred to as the field of view can be scanned and objects within the area can be detected and imaged. Thus, the field of view represents a scanning plane having a center of projection. Lissajous scanning may also be useful in other applications, such as electronic displays for rendering images thereon (e.g., displays used in augmented reality (AR) applications) and automotive headlights for steering light.

FIG. 1 is a schematic block diagrams of a 2D scanning system 100 according to one or more embodiments. The 2D scanning system 100 includes a single two-dimensional (2D) MEMS mirror 12xy that is used to steer or otherwise deflect light beams (pulses) according to a 2D scanning pattern, such as a Lissajous scanning pattern.

The MEMS mirror 12xy is a mechanical moving mirror (i.e., a MEMS micro-mirror) integrated on a semiconductor chip (not shown). A MEMS mirror according to the embodiments described herein is configured to oscillate via rotation about two resonant scanning axes (i.e., a 2D MEMS mirror) that are typically orthogonal to each other. An oscillation of the MEMS mirror on a scanning axis may be done so between two predetermined extremum deflection angles (e.g., +/−15 degrees). A Lissajous scanner, for example, is configured to control the steering of the light beams in two dimensions (e.g., in a horizontal x-direction and in a vertical y-direction).

MEMS mirror 12xy includes a first resonant scanning axis 13x (e.g., an outer scanning axis) that enables the MEMS mirror 12xy to steer light in the x-direction and a second resonant scanning axis 13y (e.g., an inner scanning axis) that enables the MEMS mirror 12xy to steer light in the y-direction. Both axes of the single 2D MEMS mirror are controlled by different phase-locked loops (PLLs). In this way, a single MEMS mirror is able to steer light beams received from the illumination unit 10 in both the x-direction and the y-direction. As a result, the MEMS mirror 12xy can direct a light beam at a desired 2D coordinate (e.g., an x-y coordinate) in the field of view. Multiple light beams can be steered by the MEMS mirror 12xy at different 2D coordinates of a Lissajous pattern.

The MEMS mirror 12xy itself is a non-linear resonator (i.e., a resonant MEMS mirror) configured to oscillate "side-to-side" about each of its scanning axes at a resonance frequency such that the light reflected from the MEMS mirror oscillates back and forth in a scanning direction of a respective scanning axis. Each resonant scanning axis has a non-linear dependency with respect to resonant frequency and maximum deflection amplitude due to the stiffening of the mirror's suspension about that axis. As will be described in further detail below, different resonance frequencies may be used for each scanning axis 13x and 13y for defining a Lissajous pattern.

The 2D scanning system 100 further includes an illumination unit 10 (i.e., a light transmitter) that includes at least one light source (e.g., at least one laser diode or light emitting diode) that is configured to transmit light beams (pulses) along a transmission path towards the MEMS mirror(s). The illumination unit 10 may sequentially transmit multiple light pulses according to a trigger signal received from a system controller 23.

The 2D scanning system 100 also includes a system controller 23 that is configured to control components of the scanning systems. In certain applications, such as LIDAR, the system controller 23 may also be configured to receive raw data from a light sensor (not illustrated) and perform processing thereon (e.g., via digital signal processing) for generating object data (e.g., point cloud data). Thus, the system controller 23 includes at least one processor and/or processor circuitry (e.g., comparators, TDCs, ADCs, and digital signal processors (DSPs)) of a signal processing chain for processing data, as well as control circuitry, such as a microcontroller, that is configured to generate control signals.

The system controller 23 is configured to generate a trigger signal used to trigger the illumination unit 10 to generate light pulses. Thus, the system controller 23 controls the timing light pulses are fired from the illumination unit 10 via the trigger signal. The system controller 23 is also configured to set a driving frequency of a MEMS mirror for each of its scanning axes and is capable of synchronizing the oscillations about the two scanning axes 13x and 13y.

The 2D scanning system 100 includes a MEMS driver 25x for driving the MEMS mirror 12xy (about the first scanning axis 13x and a MEMS driver 25y for driving the MEMS mirror 12xy about the second scanning axis 13y. Each MEMS driver 25x, 25y actuates and senses the rotation position of the mirror about its respective scanning axis, and provides position information (e.g., tilt/deflection angle or degree of rotation about the rotation axis) of the mirror to the system controller 23. Based on this position information, the laser sources of the illumination unit 10 may be triggered by the system controller 23. Thus, a higher accuracy in position sensing of the MEMS mirror results in a more accurate and precise control of other components of the scanning system.

A drive voltage (i.e., an actuation or driving signal) is applied by a MEMS driver to an actuator structure of the MEMS mirror that corresponds to its corresponding scanning axis to drive the oscillation of the MEMS mirror about that scanning axis. The drive voltage may be referred to as a high-voltage (HV). The actuator structure may include interdigitated finger electrodes made of interdigitated mirror combs and frame combs to which a drive voltage (i.e., an actuation or driving signal) is applied by the MEMS driver.

The drive voltage applied to the actuator structure creates a driving force between, for example, interdigitated mirror combs and the frame combs, which creates a torque on the mirror body about the rotation axis. The drive voltage can be switched or toggled on and off (HV on/off) or between a high voltage level and low voltage level a resulting in an oscillating driving force. The oscillating driving force causes the mirror to oscillate back and forth on its rotation axis between two extrema. The drive voltage may be a constant drive voltage, meaning that the drive voltage is the same voltage when actuated (i.e., toggled on/high). However, it will be understood that the drive voltage is being toggled on and off in order to produce the mirror oscillation. Depending on the configuration, this actuation can be regulated or adjusted by adjusting the drive voltage off time, a high voltage level of the drive voltage, a low voltage level of the driving signal, and/or a duty cycle.

The MEMS drivers $25x$ and $25y$ may also measure and record mirror frequency and currents corresponding to their respective axis using a change in capacitance in a comb-drive rotor and stator of an actuator structure used to drive the MEMS mirror $12xy$. As the MEMS mirror $12xy$ oscillates about a respective axis, the capacitance between the finger electrodes of that axis changes according to the mirror's rotational position about that axis. Each MEMS driver $25x$ and $25y$ is configured to measure the capacitance between its respective interdigitated finger electrodes, and determine a rotational position (i.e., an angular position) of the MEMS mirror $12xy$ therefrom. By monitoring the relevant capacitance, each MEMS driver $25x$ and $25y$ can detect zero-crossing events and a timing thereof of its respective axis, and can determine the tilt angle of the MEMS mirror $12xy$ at any given moment about its receptive axis.

Each MEMS driver $25x$ and $25y$ can also use the measured capacitance to determine a mirror frequency of its respective axis, and record the information in memory at the MEMS driver or at the system controller 23. The MEMS drivers $25x$ and $25y$ may further include processing circuitry, including at least one processor (e.g., analog signal processing circuitry and/or digital signal processing circuitry) configured to process measurement information from the measurement circuit to detect mirror zero-crossings and to compensate for any sensing errors (e.g., due to axes cross-coupling effects).

Additionally, or alternatively, the system controller 23 may receive measurement information from the measurement circuit of the MEMS drivers $25x$ and $25y$ and perform processing thereon. Thus, system controller 23 may further include processing circuitry, including at least one processor (e.g., analog signal processing circuitry and/or digital signal processing circuitry) configured to process measurement information from the measurement circuit to evaluate a mechanical health of the MEMS mirror $12xy$ and/or the state of the chip package.

The sensing of the position of the MEMS mirror $12xy$ is performed based on a detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., tilt angle) of the MEMS mirror. By sensing the capacitance of the finger structure, the MEMS drivers $25x$ and $25y$ can monitor and track the oscillations of the mirror, and determine a specific position of the MEMS mirror, including the zero-crossing thereof about their respective axis.

One way to measure the capacitance is to measure a current (e.g., a summed displacement current) flowing through the finger structure, convert the measured current into a voltage, and then further correlate the voltage to a capacitance and/or a rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions. The MEMS drivers $25x$ and $25y$ can also record the currents and voltages measured during the measuring of the capacitance. Thus, increasing the accuracy of position sensing of the mirror may improve the overall accuracy of the scanning system.

Since the mirror is driven about a scanning axis at an oscillation frequency, when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

By sensing the rotation position of the MEMS mirror $12xy$ about their respective scanning axes $13x$ and $13y$, the MEMS drivers $25x$ and $12y$ can sense zero-crossing (ZC) events of the MEMS mirror $12xy$. A zero-crossing event is an instance when the MEMS mirror $12xy$ has a rotation angle of 0° on its scanning axis. Specifically, it is the moment when the MEMS mirror $12xy$ is parallel to the frame or in a neutral position. The neutral position may also be referred to as a resting position (e.g., when the MEMS mirror $12xy$ comes to a stop after turning off the driving force). Since the MEMS mirror $12xy$ oscillates back and forth between two rotation directions (e.g., clock-wise and counter-clockwise), a zero-crossing event occurs twice during a scanning period—once as the mirror oscillates in the first rotation direction and once as the mirror oscillates in the second rotation direction. It will also be appreciated that angle-crossing events at another predefined angle may also be used instead of a zero-crossing event.

In some embodiments, an event time may correspond to a non-zero-crossing event. For example, the sensed rotation angle may be some angle other than 0°. However, for the purpose of explanation, examples herein will be described in the context of sensing zero-crossing events.

The MEMS drivers $25x$ and $25y$ are configured to detect each zero-crossing event and record a timing for each event. This timing information (i.e., measured zero-crossing time) can then be transmitted to the system controller 23 as position information. Specifically, the MEMS drivers $25x$ and $25y$ trigger a change in the output of a respective position signal (Position_L) at each zero-crossing event or angle-crossing event.

Figure 2:
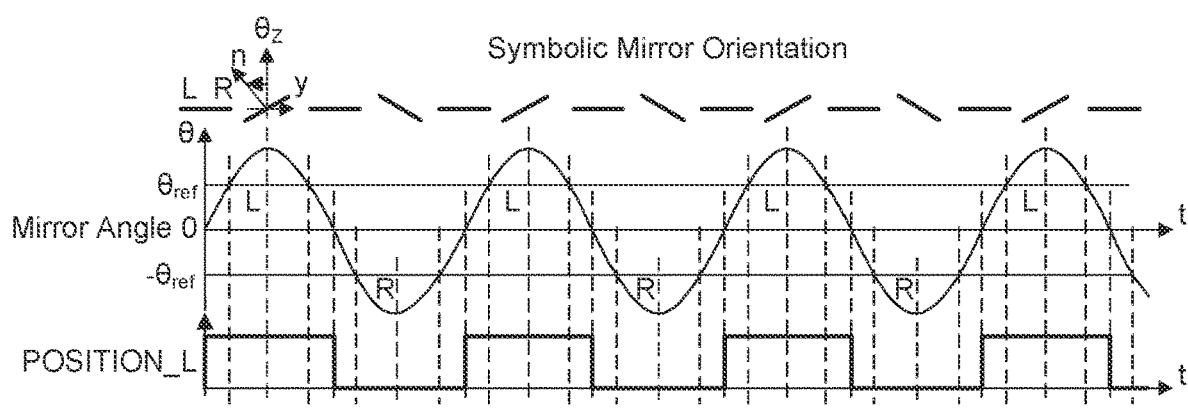
FIG. 2 illustrates a signal diagram of various signals generated by a MEMS driver based on a mirror angle θ and/or position according to one or more embodiments.

FIG. 2 illustrates a signal diagram of various signals generated by a MEMS driver 25 based on the mirror angle θ and/or position, including a position signal (Position_L). For example, the position signal (Position_L) may be a pulsed signal during which a first pulse transition (e.g., falling-edge transition) is triggered at a zero-crossing as the mirror oscillates in a first rotation direction (e.g., from left to right) and a second pulse transition (e.g., rising-edge transition) is triggered at a zero-crossing as the mirror oscillates in a second rotation direction (e.g., from right to left). Furthermore, the signal is "high" when the mirror points in one direction (e.g., points left) and the signal is "low" when the mirror points in a second direction (e.g., points right). Thus, the position signal not only indicates a zero-crossing event by triggering a pulse transition, but also indicates absolute phase information by indicating the directional tilt of the mirror. As the intervals between zero-crossing events increase, the frequency of the position signal decreases. Based on this position signal both a phase and/or a frequency of two or more position signals can be compared.

Alternatively, a short pulse may be generated by each MEMS driver 25x and 25y at the each zero-crossing event such that a pulsed position signal (Position_L) is output to the system controller 23. That is, the signal remains low (or high) between zero-crossing pulses. In this case, the absolute phase information indicating in which direction the mirror is moving would be absent. Based on this position signal a phase and/or a frequency of two or more position signals can be compared.

Each MEMS driver 25x and 25y may send the position information to the system controller 23 so that the system controller 23 can use the position information to control the triggering of the laser pulses of the illumination unit 10. The position information may also be used by the system controller as feedback information such that the system controller 23 can maintain a stable operation of the MEMS mirror 12xy via control signals provided to the MEMS drivers 25x and 25y and also maintain synchronization with other MEMS mirrors.

Hence, a scanning technique includes transmitting the beams of light into the field of view from a transmission mirror that uses two resonant scanning axes to transmit according to a Lissajous scanning pattern. The transmission mirror continuously oscillates in resonance about each scanning axis such that the beams of light are projected into the field of view that moves across the field of view as the transmission mirror changes the transmission direction. Moreover, additional conditions are set by the system controller 23 in order to generate a Lissajous scanning pattern. The following conditions are used to synchronize the driving about the two scanning axes according to the Lissajous pattern.

To make the Lissajous pattern reproduce itself periodically with a frame rate FR frequency [Hz] there are additional conditions on frequencies f1, f2 to be satisfied, wherein f1 is the driving frequency in the time domain of the MEMS mirror 12xy about the scanning axis 13x and f2 is the driving frequency in the time domain of the MEMS mirror 12xy about the scanning axis 13y. However, the oscillations about the two scanning axes may be out of synchronization and must be brought into synchronization by the system controller 23. A new frame begins each time the Lissajous pattern restarts, which occurs when a phase difference between a mirror phase about scanning axis 13x and a mirror phase about scanning axis 13y is zero.

For example, coordinates X, Y of a transmitted light beam are defined parametrically as oscillatory behaving variables in the time domain according to the following equations:

$$X = \sin(2\pi \cdot f1 \cdot t) \quad (1),$$

$$Y = \sin(2\pi \cdot f2 \cdot t) \quad (2).$$

X is the x-coordinate that corresponds to the rotation angle X of a MEMS mirror about scanning axis 13x and Y is the y-coordinate that corresponds to the rotation angle Y of a MEMS mirror about scanning axis 13y. The X and Y coordinates are sinusoidal functions that depend on driving frequencies f1, f2 and time (t). The MEMS mirror 12xy is respectively driven about the two resonant scanning axes at constant scanning frequencies f1, f2 with a defined frequency ratio (M/N) therebetween, where M and N are different integers such that the ratio is non-unitary.

To create repeatable Lissajous pattern (frame) with the frame rate FR, the system controller 23 is configured to apply synchronization and frequency tuning via control signals to the MEMS drivers 25x and 25y. As the frame rate FR is predefined, the system controller 23 may use the predefined frame rate FR as the greatest common divisor for selecting frequencies f1 and f2. In other words, the system controller 23 selects frequencies f1 and f2 such that the frame rate FR is their greatest common divisor.

Embodiments are directed to detecting, correcting, and compensating cross-coupling effects between the axes of a 2D MEMS mirror. For example, a means for compensating for mode coupling effects and motion admixtures originating from one 2D scanning axis that are superimposed onto the sensing currents of the other 2D scanning axis may be performed. Additionally, or alternatively, the driving signals (i.e., HV on/off) corresponding to each scanning axis may be compensated to account for the mode coupling effects and motion admixtures.

Figure 3:
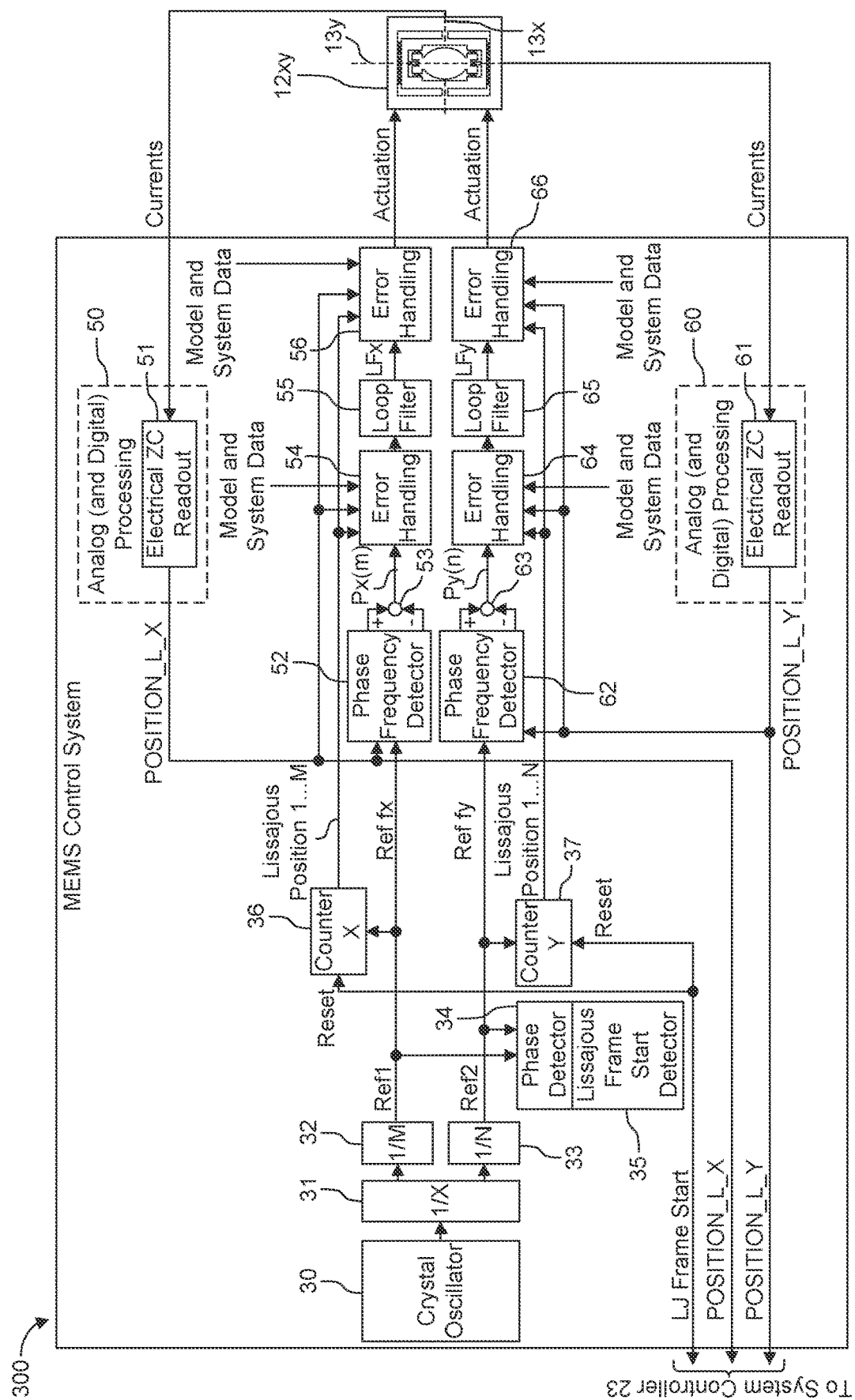
FIG. 3 is a schematic block diagram of a MEMS control system according to one or more embodiments.

FIG. 3 is a schematic block diagram of a MEMS control system 300 according to one or more embodiments. The MEMS control system 300 includes driver circuitry that combines the circuitry of the MEMS drivers 25x and 25y (e.g., two PLLs) with compensation circuitry for driving the MEMS mirror 12xy about its respective axes 13x and 13y. The compensation circuitry is provided to compensate for mode coupling effects and motion admixtures originating from one 2D scanning axis that are superimposed onto the other 2D scanning axis. In particular, compensation circuitry is configured to compensate for deterministic (e.g., modeled) parasitic cross-coupling effects (errors) where the cross-coupling error is known based on a Lissajous scanning position within a Lissajous frame. That is, each Lissajous scanning position within a Lissajous frame has a known cross-coupling error corresponding therewith that is stored in a system model generated during a system test.

The MEMS control system 300 includes a reference oscillator 30 that generates an oscillator signal (e.g., a system clock signal) at a predetermined frequency, a first frequency divider 31 that divides the predetermined frequency of the oscillator signal by an integer value X, a second frequency divider 32 that further divides the frequency output from the first frequency divider 31 by the integer value M to generate a first reference frequency f1 corresponding to the X scanning axis 13x, and a third frequency divider 33 that further divides the frequency output from the first frequency divider 31 by the integer value N to generate a second reference frequency f2 corresponding to the Y scanning axis 13y.

Accordingly, elements 30-33 generate two reference signals Ref1 and Ref2. Reference signal Ref1 has a fixed reference frequency f1 and is used as a reference signal for the PLL of the MEMS driver 25x for driving the MEMS mirror 12xy about the scanning axis 13x at the reference frequency f1. Reference signal Ref2 has a fixed reference frequency f2 and is used as a reference signal for the PLL of the MEMS driver 25y for driving the MEMS mirror 12xy about the scanning axis 13y at the reference frequency f2. The reference frequencies f1 and f2 are frequency controlled and have a predefined frequency ratio (M/N) that produces a repeatable Lissajous scanning pattern.

In addition, reference signal Ref1 may be a pulsed signal where each signal pulse corresponds to an expected zero-crossing time of the MEMS mirror 12xy about scanning axis 13x. Likewise, reference signal Ref2 may be a pulsed signal where each signal pulse corresponds to an expected zero-crossing time of the MEMS mirror 12xy about scanning axis 13y.

In order to compensate for deterministic parasitic cross-coupling effects, and, more particularly, to track the Lissajous scanning position of the MEMS mirror 12xy within a Lissajous frame, a phase detector 34, a Lissajous frame start detector 35, a first counter 36, and a second counter 37 are used. The phase detector 34 is configured to receive the two reference signals Ref1 and Ref2, detect their respective phases, and provide the phase information to the Lissajous frame start detector 35. The Lissajous frame start detector 35 is configured to detect when a phase difference of the two phases is zero—which indicates a start of a new Lissajous frame. In response to detecting the zero phase difference, the Lissajous frame start detector 35 is configured to generate a frame start signal (e.g., a signal pulse) that also acts as a reset signal for counters 36 and 37 for resetting the counters back to one (or to zero with the counters counting up to M−1 and N−1, respectively).

The first counter 36 is configured to generate a first counter value that increments up to M and the second counter 37 is configured to generate a second counter value that increments up to N. Because the reference frequencies f1 and f2 have a predefined frequency ratio (M/N), they will be back in phase (i.e., their phase difference is zero) when the first counter value is equal to M and the second counter value is equal to N. Thus, at this time, the Lissajous frame start detector 35 should generate a signal pulse that resets the counters 36 and 37 to one (or to zero with the counters counting up to M−1 and N−1, respectively).

As a result, the first counter value represents a Lissajous scanning position of the MEMS mirror 12xy within a Lissajous frame with respect to the scanning axis 13x that is divided into M discrete scanning positions (i.e., 1 to M Lissajous scanning positions). Similarly, the second counter value represents a Lissajous scanning position of the MEMS mirror 12xy within a Lissajous frame with respect to the scanning axis 13y that is divided into N discrete scanning positions (i.e., 1 to N Lissajous scanning positions). The respective scanning positions are used to determine a compensation value to be applied by the compensation circuit to compensate for the deterministic parasitic cross-coupling effects (errors). A compensation value applied in the PLL of scanning axis 13x depends on the first counter value that is representative of the X-axis Lissajous scanning position. Likewise, a compensation value applied in the PLL of scanning axis 13y depends on the second counter value that is representative of the Y-axis Lissajous scanning position.

The PLL of scanning axis 13x includes a signal processing circuit 50 (i.e., a mirror sensor) with electrical ZC readout circuit 51, a phase frequency detector 52, an error signal generator 53, an error handling block 54, a loop filter 55, and an error handling block 56. The error handling blocks 54 and 56 include processing circuitry that receives a plurality of inputs and applies a compensation value to a PPL signal to generate a compensated PLL signal.

The PLL of scanning axis 13y includes a signal processing circuit 60 with electrical ZC readout circuit 61, a phase frequency detector 62, an error signal generator 63, an error handling block 64, a loop filter 65, and an error handling block 66. The error handling blocks 64 and 66 include processing circuitry that receives a plurality of inputs and applies a compensation value to a PPL signal to generate a compensated PLL signal.

The signal processing circuit 50 is configured to measure displacement currents received from the actuator combs of scanning axis 13x and detect the zero-crossing events of the MEMS mirror 12xy with respect to scanning axis 13x. The electrical ZC readout circuit 51 is configured to generate a position signal (Position_L_X) similar to the position signal (Position_L) shown in FIG. 2 that is indicative of the measured zero-crossings occurring with respect to scanning axis 13x. Ideally, but unrealistically, the phase and frequency of position signal (Position_L_X) would be the same as the phase and frequency of the reference signal Ref1.

The signal processing circuit 60 is configured to measure displacement currents received from the actuator combs of scanning axis 13y and detect the zero-crossing events of the MEMS mirror 12xy with respect to scanning axis 13y. The electrical ZC readout circuit 61 is configured to generate a position signal (Position_L_Y) similar to the position signal (Position_L) shown in FIG. 2 that is indicative of the measured zero-crossings occurring with respect to scanning axis 13y. Ideally, but unrealistically, the phase and frequency of position signal (Position_L_Y) would be the same as the phase and frequency of the reference signal Ref2.

The phase frequency detector 52 is configured to receive the position signal (Position_L_X) and the reference signal Ref1 and detect the phases thereof. The phase frequency detector 52 may perform its phase detection at a rising edge transition (i.e., a zero to one) transition of the position signal (Position_L_X), at a falling edge transition (i.e., a one to zero) transition of the position signal (Position_L_X), or at both rising and falling edge transitions.

The error signal generator 53 is an error detector that compares the two phases and generates an error signal px(m) that depends on the phase difference of the two phases (i.e., a phase error of the position signal (Position_L_X)). More particularly, the phase error is representative of the difference between the measured zero-crossing timings provided by position signal (Position_L_X) and the expected zero-crossing timings provided by reference signal Ref1. For example, the phase error will be zero if measured zero-crossing time and expected zero-crossing time are equal. Otherwise, the phase error signal will be a non-zero value corresponding to the difference between the measured zero-crossing time and expected zero-crossing time.

The error signal px(m) is actively output for each x-axis zero-crossing of the MEMS mirror 12xy corresponding to edge detection scheme of the phase frequency detector 52. For example, if the phase frequency detector 52 detects the phases at both rising and falling edge transitions, the error signal px(m) may be actively output for each pass of the MEMS mirror (i.e., from left-to-right or right-to-left) and each zero-crossing results in a value for the error signal px(m). However, due to the cross-coupling of the two scanning axes, a sensing error is superimposed onto the phase error. Thus, the error signal px(m) includes a phase error plus a sensing error superimposed thereon. The sensing error is deterministic based on the Lissajous scanning position of the MEMS mirror 12xy within a Lissajous frame with respect to the scanning axis 13x. In other words, the sensing error is known by the system 300 based on the first counter value output by the first counter 36.

The phase frequency detector 62 is configured to receive the position signal (Position_L_Y) and the reference signal Ref2 and detect the phases thereof. The phase frequency detector 62 may perform its phase detection at a rising edge transition (i.e., a zero to one) transition of the position signal (Position_L_Y), at a falling edge transition (i.e., a one to zero) transition of the position signal (Position_L_Y), or at both rising and falling edge transitions.

The error signal generator 63 is an error detector that compares the two phases and generates an error signal py(n) that depends on the phase difference of the two phases (i.e., a phase error of the position signal (Position_L_Y)). More particularly, the phase error is representative of the difference between the measured zero-crossing timings provided by position signal (Position_L_Y) and the expected zero-crossing timings provided by reference signal Ref2. For example, the phase error will be zero if measured zero-crossing time and expected zero-crossing time are equal. Otherwise, the phase error signal will be a non-zero value corresponding to the difference between the measured zero-crossing time and expected zero-crossing time.

The error signal py(n) is actively output for each y-axis zero-crossing of the MEMS mirror 12xy corresponding to edge detection scheme of the phase frequency detector 62. For example, if the phase frequency detector 62 detects the phases at both rising and falling edge transitions, the error signal px(m) may be actively output for each pass of the MEMS mirror (i.e., from left-to-right or right-to-left) and each zero-crossing results in a value for the error signal py(n). However, due to the cross-coupling of the two scanning axes, a zero-crossing sensing error is superimposed onto the phase error. Thus, the error signal py(n) includes a phase error plus a zero-crossing sensing error superimposed thereon. The zero-crossing sensing error is deterministic based on the Lissajous scanning position of the MEMS mirror 12xy within a Lissajous frame with respect to the scanning axis 13y. In other words, the zero-crossing sensing error is known by the system 300 based on the counter value output by the second counter 37.

It is to be noted that the frame start signal, the position signal (Position_L_X), and the position signal (Position_L_Y) may be output from the MEMS control system 300 to the system controller 23, for example, to regulate a timing of firing light pulses at the MEMS mirror system.

The error handling blocks 54, 56, 64, and 66 are integrated into their respective PLLs to compensate for one or more error sources (i.e., deterministic parasitic cross-coupling effects (errors)).

One type of error source is related to issues of one axis affecting the sensing of the second axis. In this case, compensation of the zero-crossing sensing error in the position provisioning is required. In other words, this type of error is superimposed onto the displacement currents and thus affects the timing of the measured (detected) ZC events. This in turn, superimposes an additional error (i.e., the zero-crossing sensing error) onto the phase error of the error signals px(m) and py(n). For compensation, there is no need to change the actual mirror movement (i.e., no change of energy injection by the MEMS driver is needed). Instead, the first error handling block of each PLL (i.e., error handling blocks 54 and 64) compensate their respective error signals to generate compensated error signals that account for the zero-crossing sensing error.

Figure 4:
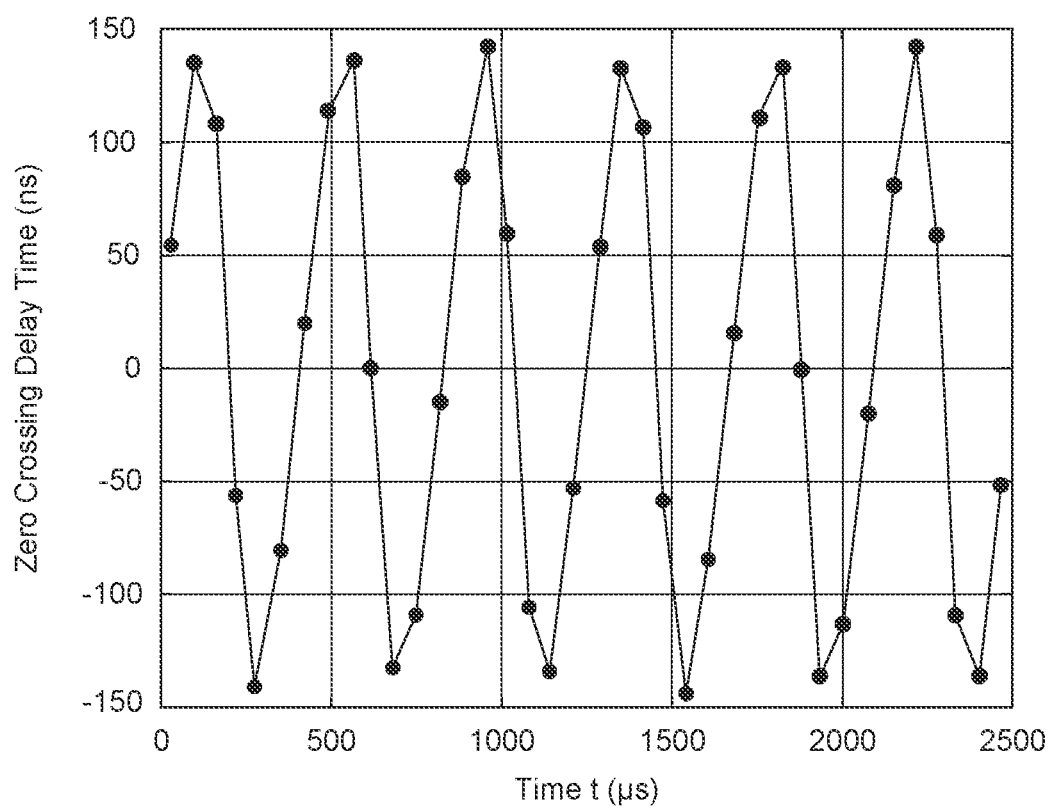
FIG. 4 illustrates a deterministic zero-crossing sensing error that is dependent on time over a Lissajous frame according to one or more embodiments.

FIG. 4 illustrates a deterministic zero-crossing sensing error that is dependent on time over a Lissajous frame according to one or more embodiments. In other words, the deterministic zero-crossing sensing error is dependent on or deterministic from the Lissajous position for a respective scanning axis of the 2D MEMS mirror 12xy. In this case, the deterministic zero-crossing sensing error is a zero-crossing delay time of measured zero crossing with respect to the mechanical zero-crossing (e.g., with respect to the expected zero-crossing) that is introduced by the cross-coupling effect of the other scanning axis. The deterministic zero-crossing sensing error is plotted or modeled over a duration of a Lissajous frame and repeats on a frame-by-frame basis. Such a zero-crossing delay time waveform is measured during a system test and stored as a deterministic system model.

System tests can be performed during manufacturing or performed periodically over the lifetime of the system in order to update the deterministic system model. The model and system data can be at least partly acquired by a calibration procedure that operates each axis individually (thus, no cross coupling is given) and then computes or learns parameters of interest for the actual error correction procedure. Analyzing the pitch-admixture case in detail reveals that the superimposed zero-crossing sensing error correlates with the frequencies of the axes and thus with the frame rate of the Lissajous pattern. By knowing this deterministic behavior, digital circuitry can be designed that compensates the measured ZC timing event with the deterministic error source.

By tracking the Lissajous scanning position of a respective scanning axis (e.g., via counter 36 or counter 37), the deterministic zero-crossing sensing error (e.g., the zero-crossing delay time) can be determined for each Lissajous scanning position and a compensation value corresponding to the deterministic zero-crossing sensing error can be applied to the error signal at each zero-crossing. The compensation value compensates for the deterministic zero-crossing sensing error (e.g., the zero-crossing delay time). This compensation is performed by error handling blocks 54 and 64 for each scanning axis. Thus, a deterministic system model is stored, for example, at the system controller 23, for each scanning axis 13x and 13y to compensate for the deterministic zero-crossing sensing error caused by cross-coupling effect of the other scanning axis.

The error handling block 54 receives the error signal px(m) (i.e., the measured phase error of zero-crossing event against the Lissajous reference signal Ref1), the current measured zero-crossing event POSITION_L_X of the scanning axis 13x, the Lissajous position inside the Lissajous pattern (e.g., represented by a counter value from counter 36), and model and system data of the overall Lissajous system provided by the system controller 23, which may include MEMS model data (e.g., deterministic zero-crossing sensing error plotted over time or over Lissajous position in reference to the X axis), including knowledge about Coriolis forces, admixture pitch effects, etc.

The model system and data may be received by the error handling block 54 and stored in one or more lookup tables (LUTs). In particular, knowledge about the relationship between the Lissajous position of the MEMS mirror within a Lissajous frame and the pitch modulation error on the zero-crossing detection event of the scanning axis is stored as part of the model and system data. Each lookup table encodes an error compensation value to each respective Lissajous position indicated by, for example, counter 36. In other words, an error compensation value is assigned to each Lissajous position 1-M such that the error compensation value is a function of Lissajous position (i.e., error_compensation(m)=f(Lissajous_position(m)), where m is the current Lissajous position for scanning axis 13x).

Based on this input data, error handling block 54 acts as filter structure that modifies (i.e., compensates) the position provisioning. For example, the admixture pitch effect is a deterministic effect that modulates the zero-crossing sensing of the outer axis based on the inner axis without changing the actual mirror movement. Thus, the error handling block 54 generates a compensated error signal px(m)' according to: compensated_phase_error(m)=phase_error(m)−error_compensation(m), thereby canceling the effect of the pitch cross-coupling from the calculated error signal px(m) and, as a consequence, from the position provisioning.

Figure 5A:
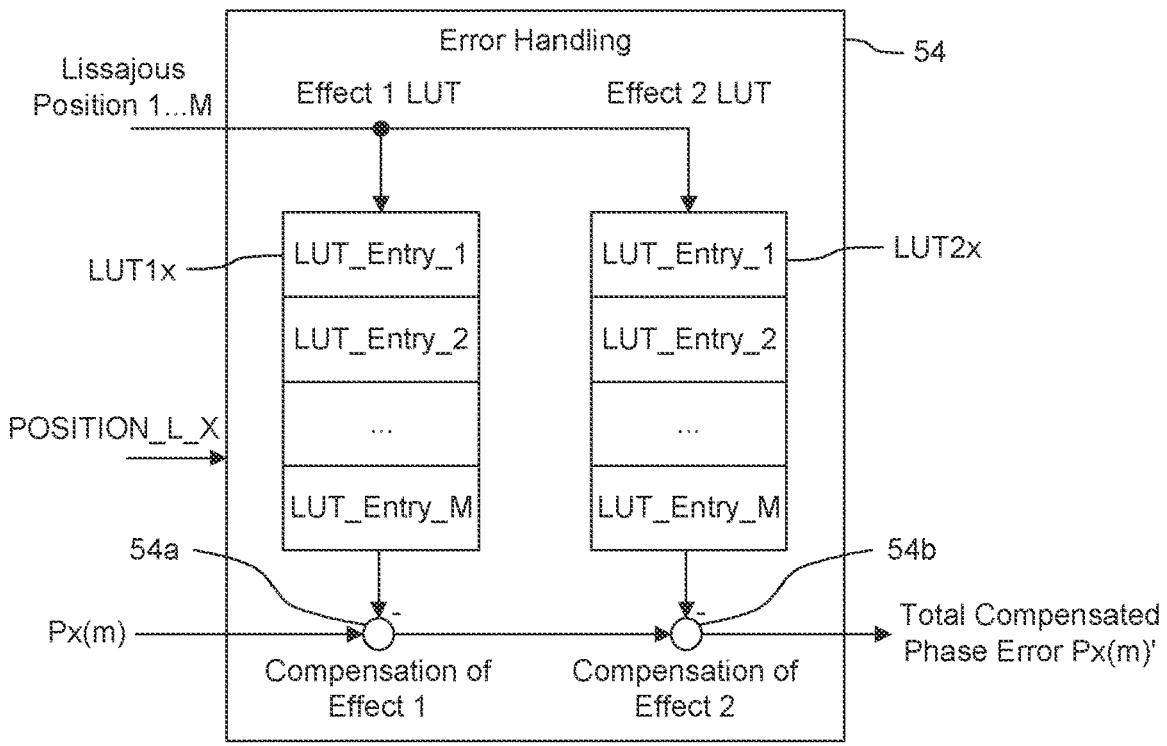
FIG. 5A is schematic block diagram of an error handling block utilizing one or more lookup tables according to one or more embodiments.

FIG. 5A is a schematic block diagram of the error handling block 54 utilizing one or more lookup tables according to one or more embodiments. Here, two lookup tables LUT1x and LUT2x are shown that compensator for different axis cross-coupling effects based on the Lissajous position 1 to M indicated by counter 36. The two lookup tables LUT1x and LUT2x are populated with compensation values provided by the model and system data as a function of the Lissajous position 1 to M. Each LUT entry 1 to M is mapped to a different Lissajous position 1 to M indicated by counter 36.

Thus, the first lookup table LUT1x is configured to receive the Lissajous position (i.e., counter value) from counter 36 and output a compensation value from the LUT entry corresponding to the received Lissajous position. For example, if the counter value is 2 (i.e., Lissajous position 2 of 1 to M), then the compensation value from the LUT_entry_2 is output from the first lookup table LUT1x. The compensation value from the first lookup table LUT1x is provided to a signal compensator 54a (e.g., a subtractor or adder) that subtracts (or adds) the compensation value from the error signal px(m).

The position signal (Position_L_X) may be used to trigger a LUT lookup operation. For example, the error handling block 54 may be triggered by the same edge detection scheme used by the phase frequency detector 52. For example, if the phase frequency detector 52 is triggered by a rising edge detection of the position signal (Position_L_X) to output the error signal px(m), the first lookup table LUT1x would similarly be triggered by rising edge detection of the position signal (Position_L_X) to output a compensation value. In this way the output of the lookup table can be synchronized with the generation of the error signal px(m).

Similarly, the second lookup table LUT2x is configured to receive the Lissajous position (i.e., counter value) from counter 36 and output a compensation value from the LUT entry corresponding to the received Lissajous position. The position signal (Position_L_X) may be used to trigger a LUT lookup operation. The compensation value from the second lookup table LUT2x is provided to a signal compensator 54b (e.g., a subtractor or adder) that subtracts (or adds) the compensation value from the error signal px(m).

It is to be noted that given the deterministic and periodic nature of the cross-coupling effects, the LUT entries follow the following rule: Sum(LUT_Entry_1, 2, . . . M)=0. In other words, the sum of all compensation values stored in LUT1x is equal to zero and the sum of all compensation values stored in LUT2x is equal to zero.

The error handling block 54 then outputs a compensated error signal px(m)' to the loop filter 55. The loop filter 55 changes the properties of the mirror driver 25x (e.g., voltage level, phase, duty cycle, etc.) according to the compensated error signal px(m)'.

The error handling block 64 receives the error signal py(n) (i.e., the measured phase error of zero-crossing event against the Lissajous reference signal Ref2), the current measured zero-crossing event POSITION_L_Y of the scanning axis 13y, the Lissajous position inside the Lissajous pattern (e.g., represented by a counter value from counter 37), and model and system data of the overall Lissajous system provided by the system controller 23, which may include MEMS model data (e.g., deterministic zero-crossing sensing error plotted over time or over Lissajous position in reference to the Y axis), including knowledge about Coriolis forces, admixture pitch effects, etc.

The model system and data may be received by the error handling block 64 and stored in one or more lookup tables (LUTs). In particular, knowledge about the relationship between the Lissajous position of the MEMS mirror within a Lissajous frame and the pitch modulation error on the zero-crossing detection event of the scanning axis is stored as part of the model and system data. Each lookup table encodes an error compensation value to each respective Lissajous position indicated by, for example, counter 37. In other words, an error compensation value is assigned to each Lissajous position 1-N such that the error compensation value is a function of Lissajous position (i.e., error_compensation(n)=f(Lissajous_position(n)), where n is the current Lissajous position for scanning axis 13y).

Based on this input data, error handling block 64 acts as filter structure that modifies (i.e., compensates) the position provisioning. For example, the admixture pitch effect is a deterministic effect that modulates the zero-crossing sensing of the outer axis based on the inner axis without changing the actual mirror movement. Thus, the error handling block 64 generates a compensated error signal py(n)' according to: compensated_phase_error(n)=phase_error(n)−error_compensation(n), thereby canceling the effect of the pitch cross-coupling from the calculated error signal py(n) and, as a consequence, from the position provisioning.

Figure 5B:
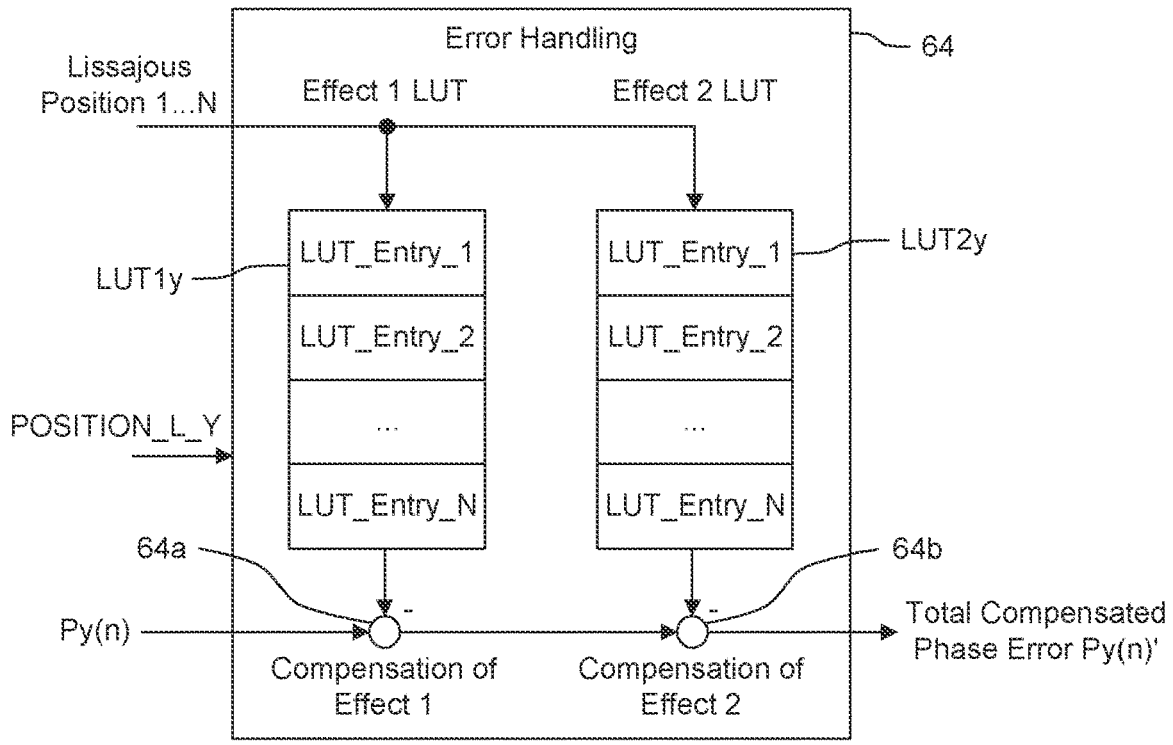
FIG. 5B is schematic block diagram of an error handling block utilizing one or more lookup tables according to one or more embodiments.

FIG. 5B is a schematic block diagram of the error handling block 64 utilizing one or more lookup tables according to one or more embodiments. Here, two lookup tables LUT1y and LUT2y are shown that compensator for different axis cross-coupling effects based on the Lissajous position 1-N indicated by counter 37. The two lookup tables LUT1y and LUT2y are populated with compensation values provided by the model and system data as a function of the Lissajous position 1-N. Each LUT_entry_1-N is mapped to a different Lissajous position 1-N indicated by counter 37.

Thus, the first lookup table LUT1y is configured to receive the Lissajous position (i.e., counter value) from counter 37 and output a compensation value from the LUT entry corresponding to the received Lissajous position. For example, if the counter value is 2 (i.e., Lissajous position 2 of 1 to N), then the compensation value from the LUT_entry_2 is output from the first lookup table LUT1y. The compensation value from the first lookup table LUT1y is provided to a signal compensator 64a (e.g., a subtractor or adder) that subtracts (or adds) the compensation value from the error signal py(n).

The position signal (Position_L_Y) may be used to trigger a LUT lookup operation. For example, the error handling block 64 may be triggered by the same edge detection scheme used by the phase frequency detector 62. For example, if the phase frequency detector 62 is triggered by a rising edge detection of the position signal (Position_L_Y) to output the error signal py(n), the first lookup table LUT1y would similarly be triggered by rising edge detection of the position signal (Position_L_Y) to output a compensation value. In this way the output of the lookup table can be synchronized with the generation of the error signal py(n).

Similarly, the second lookup table LUT2y is configured to receive the Lissajous position (i.e., counter value) from counter 37 and output a compensation value from the LUT entry corresponding to the received Lissajous position. The position signal (Position_L_Y) may be used to trigger a LUT lookup operation. The compensation value from the second lookup table LUT2y is provided to a signal compensator 64b (e.g., a subtractor or adder) that subtracts (or adds) the compensation value from the error signal py(n).

It is to be noted that given the deterministic and periodic nature of the cross-coupling effects, the LUT entries follow the following rule: Sum(LUT_Entry_1, 2, . . . N)=0. In other words, the sum of all compensation values stored in LUT1y is equal to zero and the sum of all compensation values stored in LUT2y is equal to zero.

The error handling block 64 then outputs a compensated error signal py(n)' to the loop filter 65. The loop filter 65 changes the properties of the mirror driver 25y (e.g., voltage level, phase, duty cycle, etc.) according to the compensated error signal py(n)'.

Another type of error source is related to issues of one axis affecting the movement of the other axis (e.g., due to a Coriolis effect). In this case, compensation of the actuation of the other axis is required (i.e., a change of energy injection is required). These issues are compensated by respective error handling blocks 56 and 66 in a similar manner described above in reference to error handling blocks 54 and 64 with the exception that error handling blocks 56 and 66 receive the outputs of loop filters 55 and 65, respectively, and perform compensation on the loop filter outputs LFx and LFy. The error handling blocks 56 and 66 changes the properties of their mirror drivers 25x and 25y (e.g., voltage level, phase, duty cycle, etc.) according to their compensation. Naturally, the system model and data received by the error handling blocks 56 and 66 are also different than that received by error handling blocks 54 and 64 to address the different error source and to correspond to a loop filter output as opposed to a phase error signal. For example, the compensation values may be used to compensate a voltage level, a phase, or a duty cycle of the driving signal.

Figure 6A:
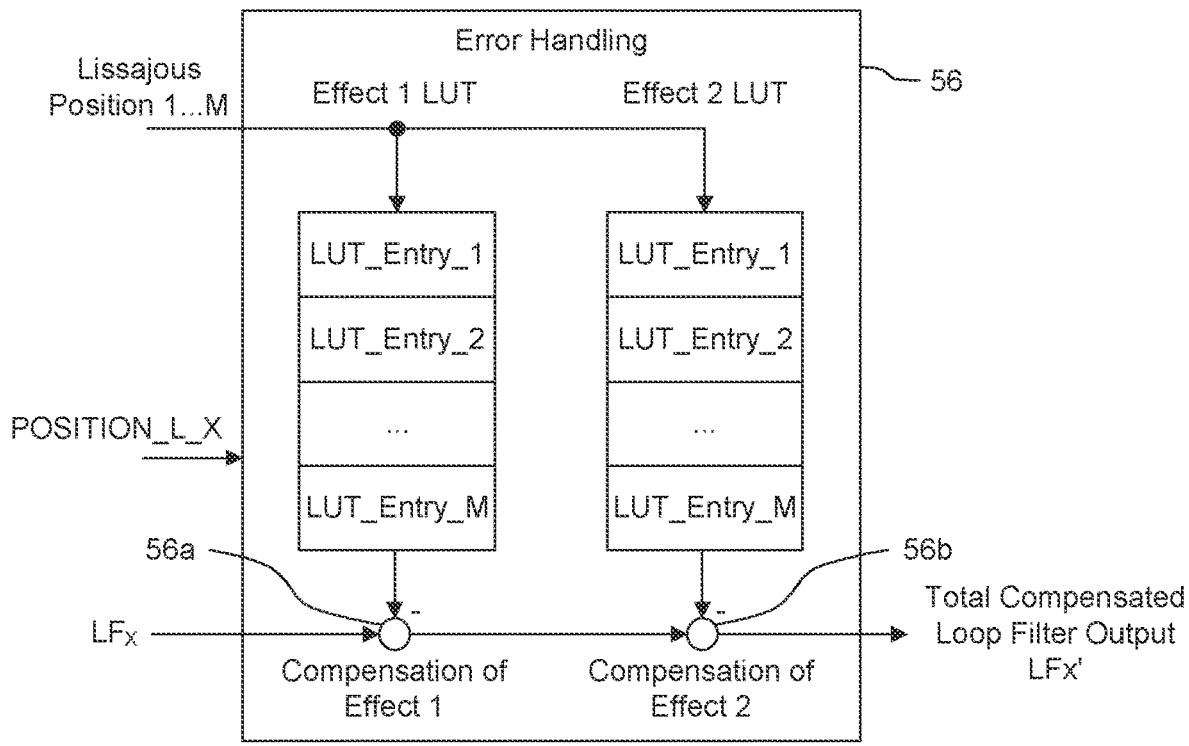
FIG. 6A is schematic block diagram of an error handling block utilizing one or more lookup tables according to one or more embodiments.

FIG. 6A is schematic block diagram of the error handling block 56 utilizing one or more lookup tables according to one or more embodiments. The error handling block 56 receives a loop filter output LFx from loop filter 55 and performs compensation thereon to generate a compensated loop filter output LFx'. The lookup and compensation operation is similar to that described above in reference to FIG. 5A with the exception of above-noted differences. One or more signal compensators 56a and 56b are used to add or subtract a compensation value to the loop filter output LFx to generate the compensated loop filter output LFx'. The compensated loop filter output LFx' is provided to the mirror driver 25x to regulate the driving signal thereof with the cross-coupling effects being compensated for (e.g., canceled).

Figure 6B:
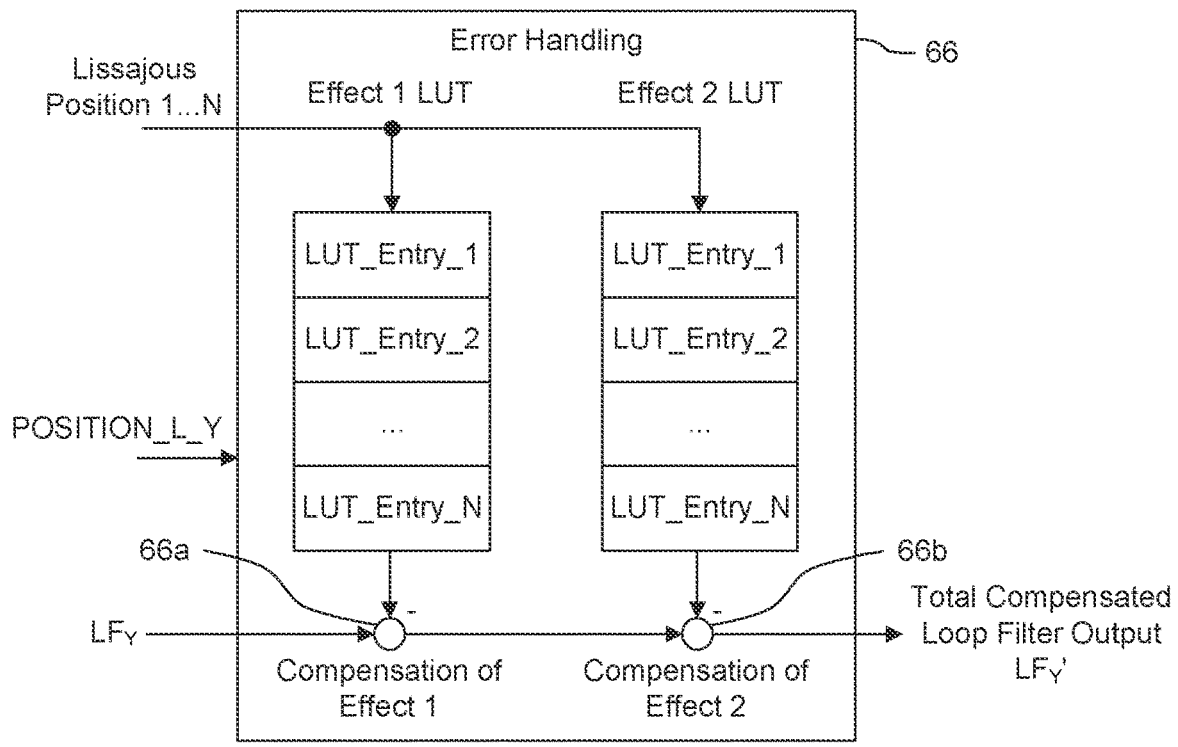
FIG. 6B is schematic block diagram of an error handling block utilizing one or more lookup tables according to one or more embodiments.

FIG. 6B is schematic block diagram of the error handling block 66 utilizing one or more lookup tables according to one or more embodiments. The error handling block 66 receives a loop filter output LFy from loop filter 65 and performs compensation thereon to generate a compensated loop filter output LFy'. The lookup and compensation operation is similar to that described above in reference to FIG. 5A with the exception of above-noted differences. One or more signal compensators 66a and 66b are used to add or subtract a compensation value to the loop filter output LFy to generate the compensated loop filter output LFy'. The compensated loop filter output LFy' is provided to the mirror driver 25y to regulate the driving signal thereof with the cross-coupling effects being compensated for (e.g., canceled).

Another type of error source is related to issues of one axis affecting the other axis but the effect cannot be sensed or measured as could be done with pitch admixture effects and Coriolis effects. In other words, the errors are known to exist but cannot be sensed. Yet, the effect may be either be added/subtracted from the error values, thus the error values can be corrected. In addition, compensation of the actuation of the other axis may be required (change of energy injection). These types of errors can be compensated in error handling blocks 54 and 64, in error handling blocks 56 and 66, or in all error handling blocks.

Figure 7:
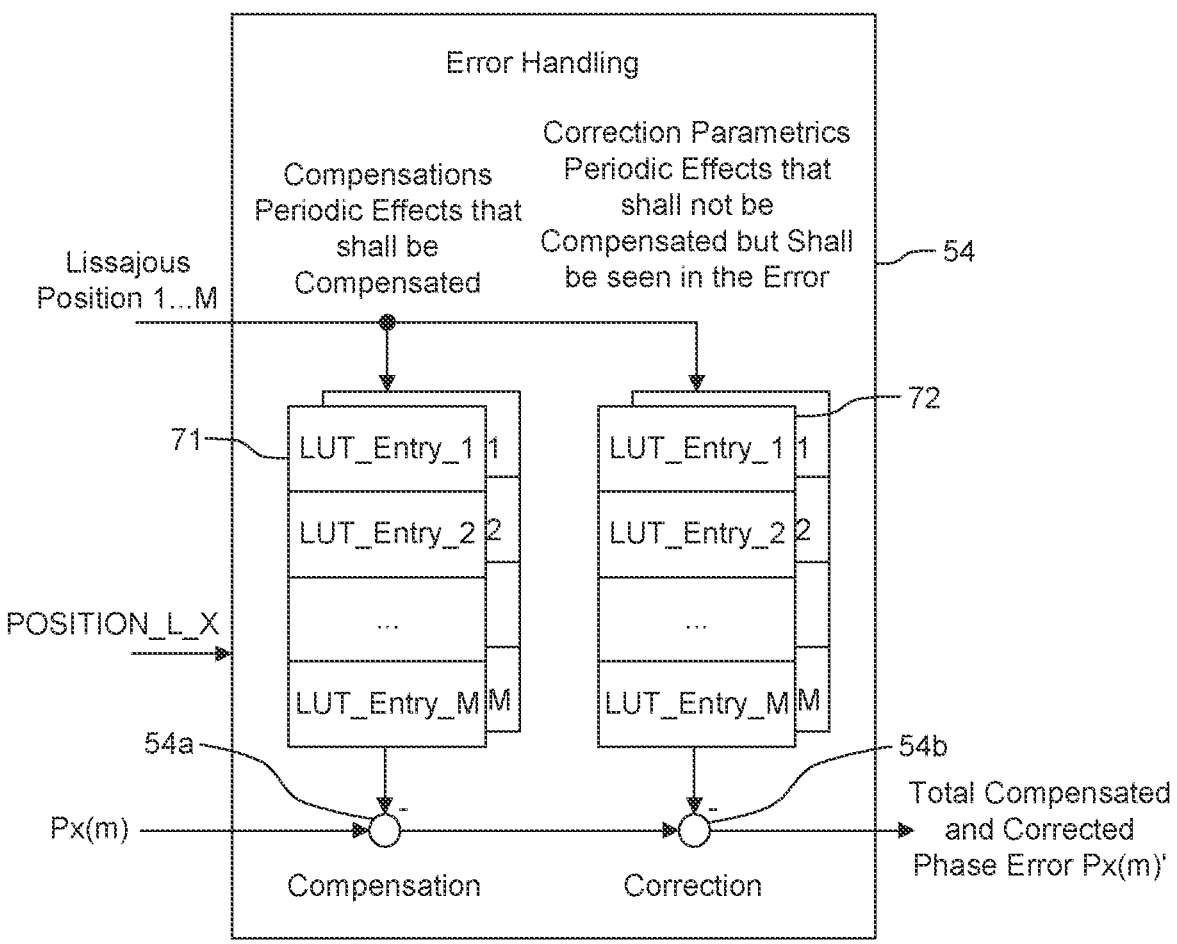
FIG. 7 is schematic block diagram of the error handling block utilizing one or more lookup tables according to one or more embodiments.

FIG. 7 is schematic block diagram of the error handling block 54 utilizing one or more lookup tables according to one or more embodiments. Here, one or more compensation lookup tables 71 are used for compensating deterministic and periodic effects. Furthermore, one or more correction lookup tables 72 with stored correction parameters are used for adding errors to the measured error signal px(m) according to the Lissajous position 1 to M. As before, each lookup table is populated based on model system and data such that each lookup table encodes an error compensation value or an error correction value to each respective Lissajous position and subsequently outputs a value based on the Lissajous position indicated by the counter 36 The signal compensators 54a and 5b are used to add or subtract a compensation value or a correction value to the error signal px(m) to generate the compensated and corrected error signal px(m)'.

Another embodiment introduces an integral way of regarding several Lissajous frames, as shown in the following equation. In this embodiment, the LUT entry(m) from the current Lissajous frame is updated with LUT entry (m−1) from the former Lissajous frame and a low-pass filtered (LPF) reduced compensation value.

$$\text{LUT Entry\_}m = \text{LUT Entry\_}(m-1) - \text{Compensation\_}(m-1)/2^{\text{LPF}}$$

According to another embodiment, f1/f2=m/n and m,n can be arbitrary numbers (e.g., non-integers) and frequencies f1 and/or f2 need not be controlled and therefore they need not be constant over time.

FIGS. 8A-8D illustrate a schematic block diagram of a PLL of MEMS control system 300 according to one or more embodiments. While FIGS. 8A-8F are directed to the PLL used for controlling the MEMS mirror 12xy about scanning axis 13x, the PLL can be similarly applied to the PLL used for controlling the MEMS mirror 12xy about scanning axis 13y. Therefore, it will be appreciated that the PLL shown in FIGS. 8A-8F can be similarly applied to both PLLs shown in FIG. 3 for driving the MEMS mirror 12xy about both axes. It is also noted that the error generator 53 is incorporated into the phase frequency detector (PFD) 52 and that the PFD 52 outputs the error signal px(m). The measured frequency of the mirror (i.e., the mirror frequency and also the frequency of the position signal Position_L) is denoted fmir.

In this example, it can be assumed that the reference frequencies f1/f2=M/N and M and N can also be arbitrary numbers (e.g. non-integers). Additionally, the reference frequencies f1 and/or f2 need not be controlled. Therefore, they need not be constant over time.

The PLL includes a mirror sensor 50 that detects zero-crossing events as described above and generates position signal Position_L with a measured mirror oscillation frequency fmir, a PFD 52 that receives both the position signal Position_L and reference signal Ref1 and generates an error signal px(m) (or py(n)), a loop filter 55 that generates a loop filter signal LFx, a mirror driver 25x is configured as a mirror scheduler that determines a subtiming of the MEMS mirror 12xy (e.g., phase and duty cycle) about scanning axis 13 as well as the low and high voltage levels of the driving signal based on the loop filter signal LFx, and the MEMS mirror 12xy that completes the loop.

The mirror driver 25x includes at least one processor for performing timing analysis and scheduling. Based on the subtiming, the mirror driver 25x is configured to generate a driving voltage HV as a control signal to control the oscillation of the MEMS mirror 12xy about scanning axis 13x. More specifically, the driving voltage is toggled between at least two voltage levels (e.g., on and off or a high voltage level and a low voltage level), and is applied to the actuator structure of the MEMS mirror 12xy above.

Figure 8A:
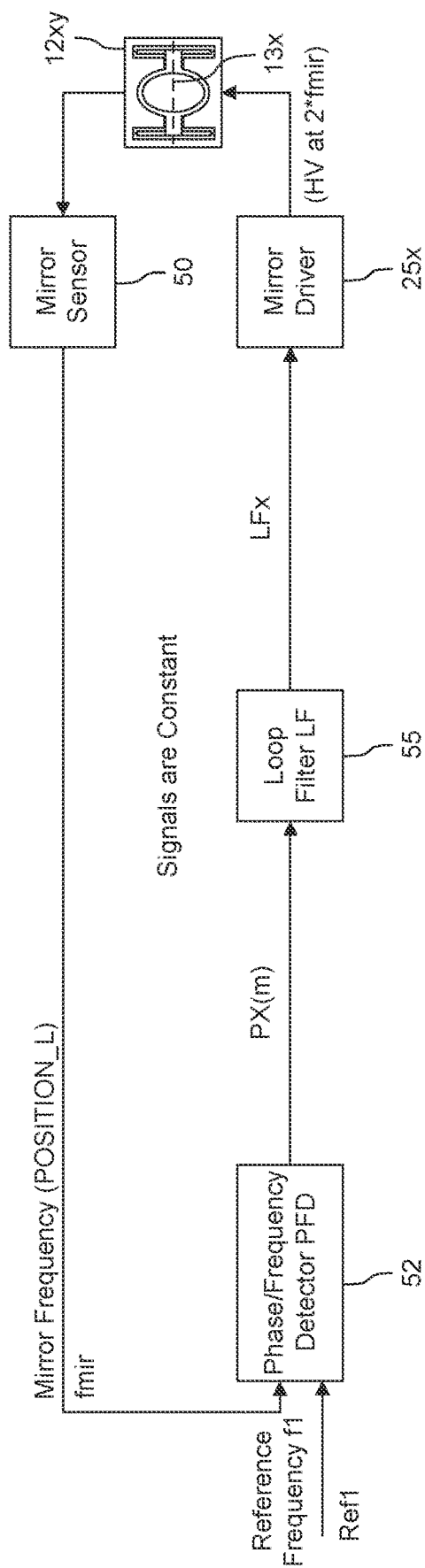

As shown in FIG. 8A, the PFD 52 may react on one or on both transition edges of the position signal Position_L. In an undisturbed (ideal) operation, the measured mirror oscillation frequency fmir has the same frequency as the reference frequency f1 and a constant (ideally 0) phase causing a PFD output (i.e., an error signal px(m)) that does not change the loop filter output LFx so that the mirror driver 25x drives the MEMS mirror 12xy with a driving signal that has a stationary pulse train. It is noted that capacitively actuated mirrors are usually driven with double the mirror oscillation frequency fmir.

Figure 8B:
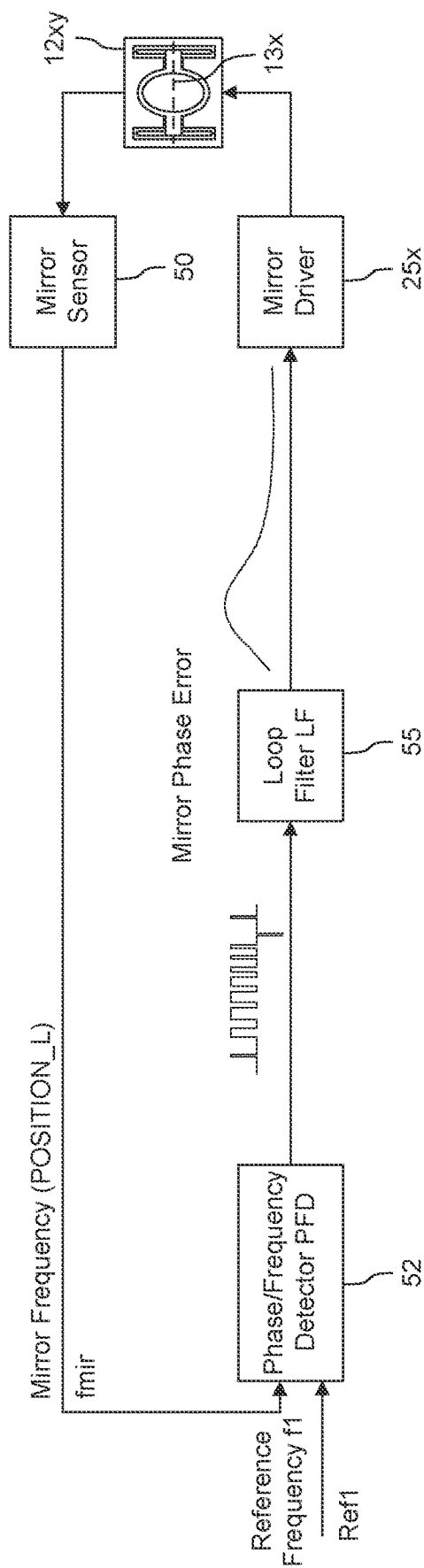

As shown in FIG. 8B, if the mirror oscillation is disturbed by any influence, the measured mirror oscillation frequency fmir deviates from the reference frequency f1 causing a mirror phase error signal px(m) to deviate from than zero that is to be regulated by the PLL. The PFD 52 detects the deviation, the loop filter 55 filters the error signal px(m) and changes the properties of the mirror driver output signal (voltage, phase, duty cycle, etc.) according to the detected phase error. Assuming the PLL is correctly parametrized, the mirror oscillation is adapted by the PLL so that the disturbance is cancelled and fmir is synchronized to the reference frequency f1 again.

As shown in FIG. 8C, if the mirror oscillation is systematically influenced, for example, by a second axis oscillating at a different frequency, the phase of the measured mirror oscillation frequency fmir systematically deviates from the phase of the reference frequency f1 in a sinusoidal way or in an overlay of several sinusoidals, for example, as shown in FIG. 4. The PFD 52 detects the phase deviations and the PLL continuously tries to adapt the mirror oscillation to the periodic disturbances. These periodic (sinusoidal) disturbances are referred to as deterministic errors and those caused by the other axis of the a 2D MEMS mirror are referred to as deterministic cross-coupling effects or errors that can be evaluated in a system test and stored as model and system data that is deterministic based on the Lissajous position. These periodic disturbances cause unnecessary regulation effort, and the part of the systematic phase error not filtered by loop filter 55 and oscillation inertia will be visible in the mirror oscillation.

As shown in FIG. 8D, the error handling block 54 is added to the PLL between the PFD 52 and the loop filter 55. The error handling block 54 compensates for the systematic phase error signal (e.g., the sensing error) present in the error signal px(m) to generate a compensated error signal px(m)'. The error handling block 54 can be realized as one or more lookup tables, as described above, or as a PLL.

Figure 9A:
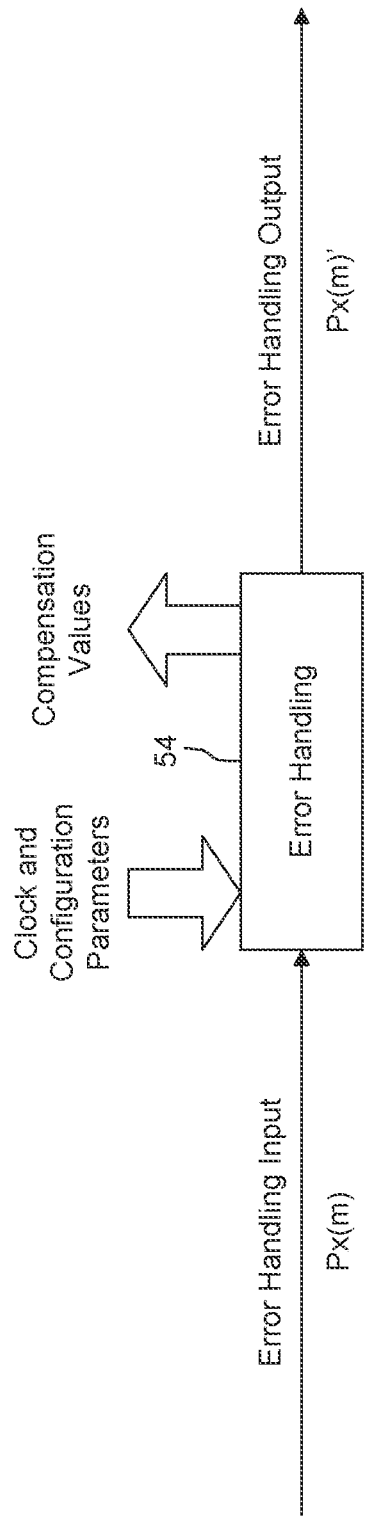
FIGS. 9A-9C illustrate a schematic block diagram of an error handling block of the MEMS control system according to one or more embodiments.
Figure 9B:
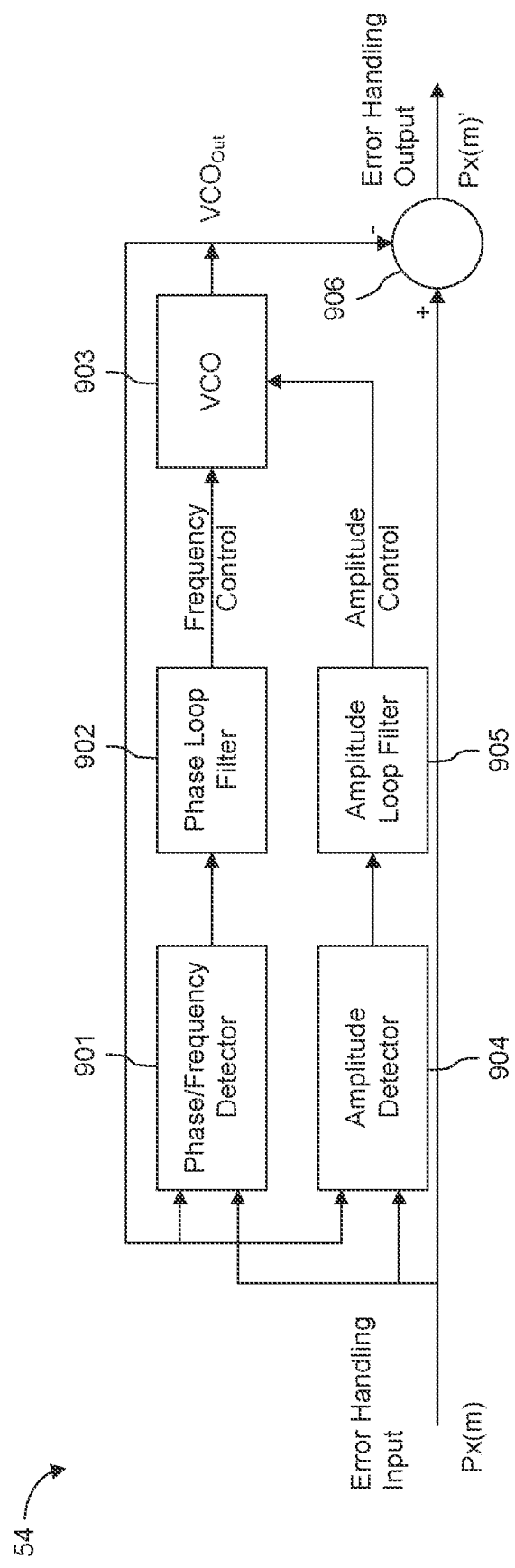
Figure 9C:
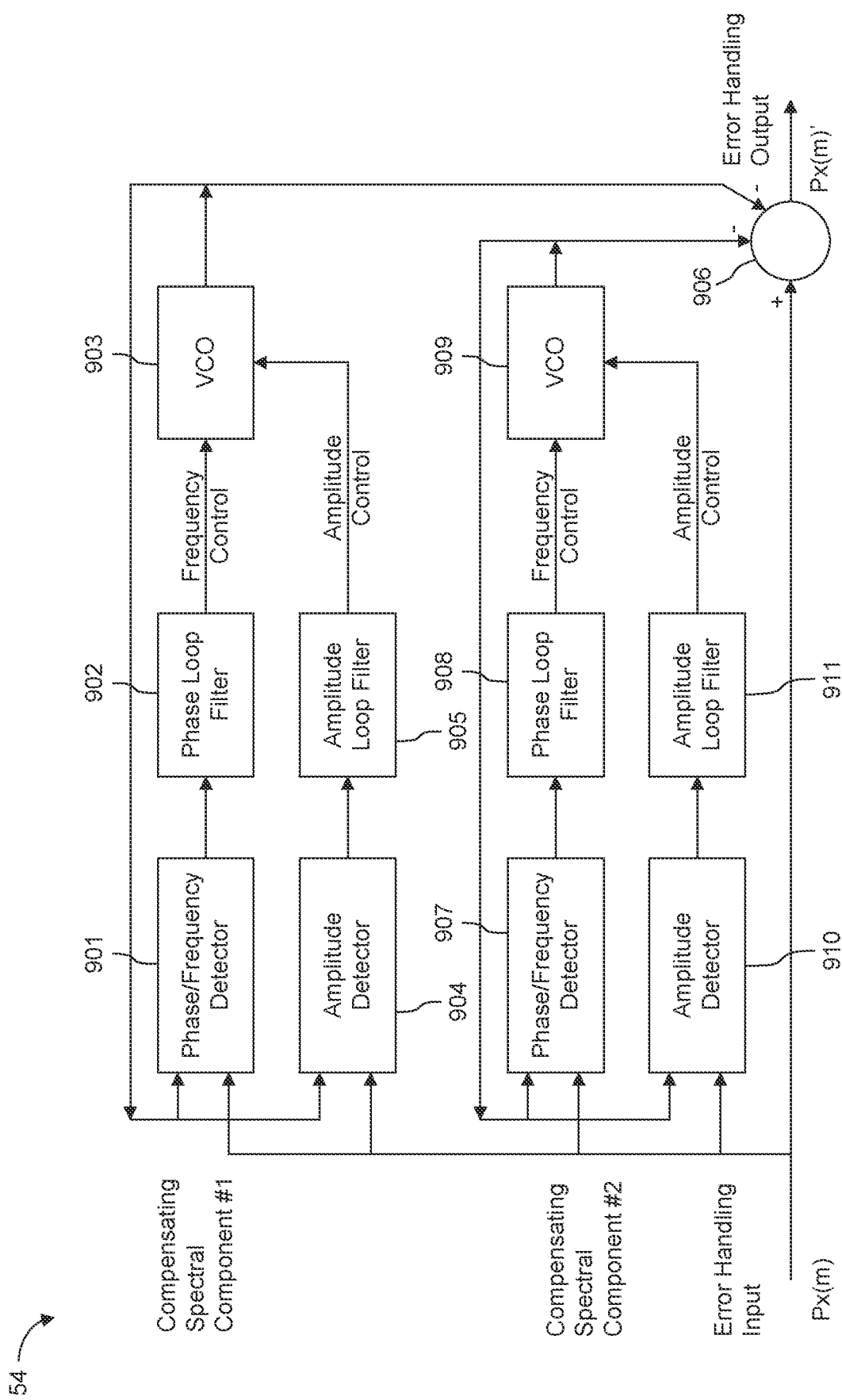

FIGS. 9A-9C illustrate a schematic block diagram of the error handling block 54 of MEMS control system 300 according to one or more embodiments. While FIGS. 9A-9C are directed to error handling block 54, they can be similarly applied to any of the error handling blocks disclosed herein. In addition, while the error handling block 54 may be realized by one or more lookup tables, for example, as shown in FIG. 5A, FIGS. 9A-9C are directed to realizing the error handling block 54 with one or more dedicated PLLs. Each dedicated PLL follows a period of a parasitic effect. Thus, each dedicated PLL is configured to compensate for a different periodic (sinusoidal) parasitic effect that causes a deterministic systematic error or may compensate for different spectral components of a deterministic systematic error. Important values, such as phase position and amplitude, may be determined via a learning phase and refined and adapted during operation (i.e., throughout the lifetime of the MEMS mirror 12xy).

As shown in FIG. 9A, the error handling block 54 is configured with suitable compensation parameters like frequency, amplitude, and phase with respect to a position within a Lissajous frame. The error handling block 54 also receives a clock signal in case the whole circuitry 901 to 906 is realized digitally. If integrated on a chip, digital realization uses less area than analog realization. The error handling block 54 may also output current compensation values to the system controller 23 that may monitor the compensation values and adjust the configuration parameters based on the monitoring. The configuration parameters may be used to configure one or more phase loop filters and one or more amplitude loop filters.

As shown in FIG. 9B, the error handling block 54 includes two control loops—a compensation PLL used for phase and frequency control of a voltage controlled oscillator (VCO) and an amplitude control loop used for amplitude control of the voltage controlled oscillator (VCO).

The compensation PLL includes PFD 901, a phase loop filter 902, and the VCO 903. The PFD 901 outputs a phase error between the phase of the error signal px(m) and a phase of an output signal VCOout of the VCO 903.

The amplitude control loop includes an amplitude detector 904, an amplitude loop filter 905, and the VCO 903. The amplitude detector 904 output an amplitude error between an amplitude of the error signal px(m) and an amplitude of the output signal VCOout of the VCO 903.

The compensation PLL regulates the phase of the VCO 903 to synchronize the phase of the VCO 903 with the systematic periodic (sinusoidal) phase error present in the error signal px(m). As soon as the phases are in sync, the amplitude control loop regulates the amplitude of the VCO 903 to the correct amplitude value so that the VCO output signal VCOout replicates the systematic phase error at the compensated error signal px(m)'. In other words, the VCO 903 generates an output signal VCOout that replicates a periodic error signal included in the error signal px(m), with the periodic error signal being caused by the periodic (sinusoidal) parasitic effect. Both the amplitude and phase of the VCO output signal VCOout is matched by the control loops to the amplitude and phase of the periodic error signal.

The periodic error signal is superimposed onto the mirror phase error detected by the PFD 52. By replicating the periodic error signal in both phase and amplitude, the periodic error signal (i.e., VCOout) can be subtracted from the error signal px(m) by a signal compensator 906 (e.g., a subtractor) to generate the compensated error signal px(m)'. Subtracting the VCO output signal VCOout from error signal px(m) leads to a constant signal at the output of the signal compensator 906 instead of a periodic one. It is also contemplated that other methods to match phase and amplitude may be used to replicate the systematic phase error.

As shown in FIG. 9C, the error handling block 54 includes two pairs of control loops connected and operated in parallel, each control loop pair having a compensation PLL used for phase and frequency control of its respective voltage controlled oscillator (VCO) and an amplitude control loop used for amplitude control of its respective voltage controlled oscillator (VCO). Each control loop pair is configured to compensate for a different spectral component of the error signal px(m). As noted above, the error signal px(m)

may include an overlay of several sinusoidals (i.e., several periodic spectral error components).

The first control loop pair is comprised of the control loops described in FIG. 9B with the phase loop filter 902 and the amplitude loop filter 905 being parametrized so that the bandwidth of the loops is sufficiently small to only react on a targeted spectral component of a systematic phase error to compensate for spectral component #1. The VCO output signal of the VCO 903 is a replica of its targeted spectral component of the systematic phase error.

The second control loop pair is similar to the first control loop pair but is parametrized so that the bandwidth of the loops is sufficiently small to only react on a different targeted spectral component of the systematic phase error to compensate for spectral component #2. The second control loop pair includes a compensation PLL, including PFD 907, a phase loop filter 908, and a VCO 909, and an amplitude control loop, including amplitude detector 910, an amplitude loop filter 911, and the VCO 909. The compensation PLL regulates the phase of the VCO 909 to synchronize the phase of the VCO 909 with phase of the targeted systematic periodic (sinusoidal) phase error present in the error signal px(m). As soon as the phases are in sync, the amplitude control loop regulates the amplitude of the VCO 909 to the correct amplitude value so that the VCO output signal of the VCO 909 replicates the second targeted spectral component of the systematic phase error at the compensated error signal px(m)'. In other words, the VCO 909 generates an output signal that replicates another targeted spectral component of the periodic error signal within a predetermined bandwidth of the error signal px(m), with the targeted spectral component being caused by a targeted periodic (sinusoidal) parasitic effect. Both the amplitude and phase of the VCO output signal are matched by the control loops to the amplitude and phase of the second targeted spectral component of the systematic phase error.

As a result of the two PLL pairs, two different spectral components of the periodic error signal are replicated and subsequently subtracted by the signal compensator 906 from the error signal px(m) to generate the compensated error signal px(m)' that is free of the two different spectral components.

The detectors, the loop filters, the VCO, and the subtractor may preferably be implemented digitally. The digital implementation of the VCO (i.e., a digitally controlled oscillator) may be realized as counter. The loop filters 902, 905, 908, and 911 can be parametrized via the configuration parameters so that the bandwidth of their loops is sufficiently small to only react on a targeted systematic phase error or a spectral component thereof and not on random phase errors caused by disturbances. If the systematic phase error includes more than one significant spectral component, a suitable number of error handling PLL pairs can be used, each one compensating its dedicated spectral component of the systematic phase error.

It will also be appreciated that the properties of the MEMS mirror 12xy may change with temperature or over the lifetime of the mirror, for example, due to aging effects. Thus, it naturally flows that the systematic phase error may also change with temperature or over the lifetime of the mirror. The system controller 23 may receive feedback information (e.g., compensation values) from the error handling block 54 and may continuously or periodically adjust the parameters of the loop filters 902, 905, 908, and 911 to account for temperature changes and aging effects. In addition, an error handling block running out of a defined frequency or amplitude window may indicate unsafe deterioration of the MEMS mirror 12xy and may forward this finding to a functional safety mechanism, such as the system controller 23.

An additional embodiment is provided below.

1. An oscillator control system includes an oscillator structure configured to oscillate about first and second rotation axes according to a Lissajous pattern, wherein an oscillation about the second rotation axis imparts a cross-coupling error onto an oscillation about the first rotation axis, and wherein the cross-coupling error changes in accordance with a Lissajous position within the Lissajous pattern; and a driver circuit that includes a PLL configured to regulate a driving signal that drives the oscillation about the first rotation axis. The PLL is configured to generate a PLL signal based on a phase error of the oscillation about the first rotation axis. The PLL includes a compensation circuit configured to receive the PLL signal and the Lissajous position within the Lissajous pattern, apply a compensation value to the PLL signal to generate a compensated PLL signal used for generating the driving signal based on the current Lissajous position of the oscillator structure within the Lissajous pattern.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Although various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An oscillator control system, comprising:
an oscillator structure configured to simultaneously oscillate about a first rotation axis and a second rotation axis according to a Lissajous pattern that repeats on a frame-by-frame basis, wherein an oscillation about the second rotation axis imparts a deterministic cross-coupling error onto an oscillation about the first rotation axis, and wherein the deterministic cross-coupling error changes in accordance with a Lissajous position within the Lissajous pattern; and
a driver circuit configured to generate a first driving signal to drive the oscillator structure about the first rotation axis at a first driving frequency and generate a second driving signal to drive the oscillator structure about the second rotation axis at a second driving frequency that is different from the first driving frequency to generate the Lissajous pattern,
wherein the driver circuit comprises a phase-locked loop (PLL) configured to regulate the oscillation about the first rotation axis,
wherein the PLL is configured to generate a PLL signal based on a phase error of the oscillation about the first rotation axis,
wherein the PLL comprises a compensation circuit configured to receive the PLL signal and a Lissajous position signal that indicates the Lissajous position within the Lissajous pattern, wherein the compensation circuit is configured to apply a compensation value to the PLL signal, thereby modifying the PLL signal to generate a compensated PLL signal used for generating the first driving signal, wherein the compensation circuit is configured to determine the compensation value based on the Lissajous position indicated by the Lissajous position signal.

2. The oscillator control system of claim 1, wherein the compensation circuit is configured to receive compensation information comprising a first set of compensation values, wherein each compensation value of the first set of compensation values is encoded to a different Lissajous position within the Lissajous pattern, and
wherein the compensation circuit is configured to select a compensation value from the first set of compensation values based on the Lissajous position indicated by the Lissajous position signal and apply the selected compensation value of the first set of compensation values to the PLL signal, thereby modifying the PLL signal to generate a compensated PLL signal used for generating the first driving signal.

3. The oscillator control system of claim 2, wherein the selected compensation value corresponds to a predetermined component of the deterministic cross-coupling error that occurs at the Lissajous position indicated by the Lissajous position signal.

4. The oscillator control system of claim 2, wherein the compensation circuit is configured to use the selected compensation value to filter the deterministic cross-coupling error from the PLL signal to generate the compensated PLL signal.

5. The oscillator control system of claim 1, wherein the deterministic cross-coupling error is a periodic cross-coupling error that changes in accordance with the Lissajous position within the Lissajous pattern in a sinusoidal manner.

6. The oscillator control system of claim 1, further comprising:
a Lissajous position counter configured to generate the Lissajous position signal as a plurality of counter values that are sequentially output in discrete increments, wherein each counter value corresponds to a different Lissajous position within the Lissajous pattern.

7. The oscillator control system of claim 6, wherein the compensation circuit is configured to receive compensation information comprising a first set of compensation values, wherein each compensation value of the first set of compensation values is encoded to a different Lissajous position within the Lissajous pattern,
wherein the compensation circuit is configured to select a compensation value from the first set of compensation values based on the Lissajous position indicated by the Lissajous position signal and apply the selected compensation value of the first set of compensation values to the PLL signal, thereby modifying the PLL signal to generate a compensated PLL signal used for generating the first driving signal, and
wherein the compensation circuit comprises a lookup table having each counter value assigned to a different compensation value of the first set of compensation values, wherein the lookup table is configured receive the Lissajous position signal and select the compensation value from the first set of compensation values according to a counter value received in Lissajous position signal.

8. The oscillator control system of claim 6, wherein the plurality of counter values is a predetermined number of counter values and the Lissajous position counter is configured to reset on the frame-by-frame basis.

9. The oscillator control system of claim 1, wherein the PLL comprises a phase error detector configured to generate a phase error signal based on a phase deviation of the oscillation about the first rotation axis from an expected oscillation phase and output the phase error signal as the PLL signal.

10. The oscillator control system of claim 9, wherein the deterministic cross-coupling error is superimposed onto the phase error signal.

11. The oscillator control system of claim 1, further comprising:
a mirror position measurement circuit configured to measure a rotation angle of the oscillator structure about the first rotation axis and generate a measurement signal indicative of a measured phase of the oscillation about the first rotation axis,
wherein the PLL comprises a phase error detector configured to receive the measurement signal and a reference signal indicative of a reference phase, generate a phase error signal based on a phase deviation of the measured phase from the reference phase, and output the phase error signal as the PLL signal.

12. The oscillator control system of claim 11, wherein the measured phase systematically deviates from the reference phase in a sinusoidal manner.

13. The oscillator control system of claim 11, wherein:
the mirror position measurement circuit is configured to detect event times of the oscillating structure based on the measured rotation angle, wherein an event time is detected at each time instance the measured rotation angle crosses a target rotation angle of one or more target rotation angles, the reference signal includes expected event times of the oscillator structure oscillating about the first rotation axis, and the phase error signal is representative of a timing difference between the detected event times and the expected event times.

14. The oscillator control system of claim 13, wherein:
the detected event times are detected zero-crossing times at which a rotation angle of the oscillating structure is 0° as the oscillating structure oscillates about the first rotation axis, and the expected event times are expected zero-crossing times at which the rotation angle of the oscillating structure is expected to be 0°.

15. The oscillator control system of claim 1, wherein the PLL comprises:
a phase error detector configured to generate a phase error signal based on a phase deviation of the oscillation about the first rotation axis from an expected oscillation phase and output the phase error signal; and a loop filter configured to receive the phase error signal, generate a loop filter signal based on the phase error signal, and output the loop filter signal as the PLL signal, wherein the loop filter signal regulates at least one property of the first driving signal.

16. The oscillator control system of claim 2, wherein a sum of the first set of compensation values is zero.

17. The oscillator control system of claim 2, wherein:
the compensation information comprises a second sent of compensation values, wherein each compensation value of the second set of compensation values is encoded to a different Lissajous position within the Lissajous pattern, and the compensation circuit is configured to select a compensation value from the second set of compensation values based on the Lissajous position indicated by the Lissajous position signal and apply the selected compensation value of the second set of compensation values to the PLL signal, thereby modifying the PLL signal to generate the compensated PLL signal used for generating the first driving signal.

18. A method for controlling an oscillator structure, the method comprising:
driving the oscillator structure to simultaneously oscillate about a first rotation axis and a second rotation axis according to a Lissajous pattern that repeats on a frame-by-frame basis, wherein an oscillation about the second rotation axis imparts a deterministic cross-coupling error onto an oscillation about the first rotation axis, wherein the deterministic cross-coupling error changes in accordance with a Lissajous position within the Lissajous pattern, wherein driving the oscillator structure further includes generating a first driving signal to drive the oscillator structure about the first rotation axis at a first driving frequency and generating a second driving signal to drive the oscillator structure about the second rotation axis at a second driving frequency that is different from the first driving frequency to generate the Lissajous pattern;

regulating the oscillation about the first rotation axis with a phase-locked loop (PLL), including generating a PLL signal based on a phase error of the oscillation about the first rotation axis; and compensating the PLL signal using a Lissajous position signal that indicates the Lissajous position within the Lissajous pattern and compensation information comprising a first set of compensation values, wherein each compensation value of the first set of compensation values is encoded to a different Lissajous position within the Lissajous pattern, wherein compensating the PLL signal further includes selecting a compensation value from the first set of compensation values based on the Lissajous position indicated by the Lissajous position signal and applying the selected compensation value of the first set of compensation values to the PLL signal, thereby modifying the PLL signal to generate a compensated PLL signal used for generating the first driving signal.

19. An oscillator control system, comprising:
an oscillator structure configured to oscillate about a first rotation axis and a second rotation axis according to a Lissajous pattern, wherein an oscillation about the second rotation axis imparts a cross-coupling error onto an oscillation about the first rotation axis, and wherein the cross-coupling error changes in accordance with a Lissajous position within the Lissajous pattern; and a driver circuit that includes a phase-locked loop (PLL) configured to regulate a driving signal that drives the oscillation about the first rotation axis, wherein the PLL is configured to generate a PLL signal based on a phase error of the oscillation about the first rotation axis, and wherein the PLL includes a compensation circuit configured to receive the PLL signal and the Lissajous position within the Lissajous pattern, apply a compensation value to the PLL signal to generate a compensated PLL signal used for generating the driving signal based on the Lissajous position of the oscillator structure within the Lissajous pattern.

* * * * *